United States Patent
Wang et al.

(10) Patent No.: US 7,358,783 B1
(45) Date of Patent: *Apr. 15, 2008

(54) VOLTAGE, TEMPERATURE, AND PROCESS INDEPENDENT PROGRAMMABLE PHASE SHIFT FOR PLL

(75) Inventors: Bonnie I. Wang, Cupertino, CA (US); Joseph Huang, San Jose, CA (US); Chiakang Sung, Milpitas, CA (US); Xiaobao Wang, Santa Clara, CA (US); In Whan Kim, Santa Clara, CA (US); Wayne Yeung, San Francisco, CA (US); Khai Nguyen, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/400,191

(22) Filed: Mar. 25, 2003

Related U.S. Application Data

(63) Continuation of application No. 09/731,473, filed on Dec. 5, 2000, now Pat. No. 6,642,758, which is a continuation-in-part of application No. 09/432,142, filed on Nov. 2, 1999, now Pat. No. 6,369,624.

(60) Provisional application No. 60/169,161, filed on Dec. 6, 1999, provisional application No. 60/107,166, filed on Nov. 5, 1998, provisional application No. 60/107,101, filed on Nov. 4, 1998, provisional application No. 60/106,876, filed on Nov. 3, 1998.

(51) Int. Cl.
*H03L 7/095* (2006.01)

(52) U.S. Cl. .................. 327/156; 327/159; 327/160

(58) Field of Classification Search .............. 327/156, 327/159, 160; 331/17, 25
See application file for complete search history.

(56) References Cited

U.S. PATENT DOCUMENTS

| 4,473,885 A | * | 9/1984 | Kamimaru et al. ......... 708/103 |
| 4,512,030 A | | 4/1985 | Fukuta |
| 4,759,043 A | | 7/1988 | Lewis |
| 5,059,924 A | | 10/1991 | JenningsCheck ............. 331/14 |
| 5,170,297 A | | 12/1992 | Wahler et al. |
| 5,185,581 A | | 2/1993 | Brown |
| 5,298,866 A | | 3/1994 | Kaplinsky .................... 327/158 |

(Continued)

OTHER PUBLICATIONS

"ORCA® OR3Cxx (5 V) and OR3Txxx (3.3. V) Series Field-Programmable Gate Arrays," Lucent Technologies Microelectronics Group, Preliminary Data Sheet, Nov. 1997.

(Continued)

*Primary Examiner*—N. Drew Richards
*Assistant Examiner*—An T. Luu
(74) *Attorney, Agent, or Firm*—Ropes & Gray LLP; Jeffrey H. Ingerman; Chia-Hao La

(57) ABSTRACT

A circuit provides a programmable phase shift feature, where the phase shift is programmably selectable by a user. This circuitry may be incorporated in a programmable logic device (PLD) or field programmable gate array (FPGA) to provide additional programmability features. The programmable phase shift circuitry may be implemented within a phase locked loop (PLL) or delay locked loop (DLL) circuit. In an implementation, the programmable phase shift circuitry is implemented using two programmable counters.

19 Claims, 24 Drawing Sheets

U.S. PATENT DOCUMENTS

| | | | |
|---|---|---|---|
| 5,428,317 A * | 6/1995 | Sanchez et al. | 331/1 A |
| 5,451,912 A | 9/1995 | Torode | |
| 5,559,844 A | 9/1996 | Lee | |
| 5,561,692 A | 10/1996 | Maitland et al. | 375/371 |
| 5,600,271 A | 2/1997 | Erickson et al. | |
| 5,631,920 A | 5/1997 | Hardin | |
| 5,635,879 A | 6/1997 | Sutardja et al. | 331/57 |
| 5,642,082 A | 6/1997 | Jefferson | 331/25 |
| 5,699,020 A | 12/1997 | Jefferson | 331/1.7 |
| 5,701,270 A | 12/1997 | Rao | |
| 5,731,743 A | 3/1998 | Sauer | |
| 5,744,991 A | 4/1998 | Jefferson et al. | 327/158 |
| 5,783,971 A | 7/1998 | Dekker | |
| 5,864,258 A * | 1/1999 | Cusinato et al. | 331/34 |
| 5,889,436 A | 3/1999 | Yeung et al. | 331/2 |
| 5,896,346 A | 4/1999 | Dell et al. | |
| 5,963,069 A | 10/1999 | Jefferson et al. | 327/158 |
| 5,970,110 A | 10/1999 | Li | 327/147 |
| 6,049,236 A * | 4/2000 | Walden | 327/99 |
| 6,100,735 A | 8/2000 | Lu | 327/158 |
| 6,114,915 A * | 9/2000 | Huang et al. | 331/25 |
| 6,208,182 B1 * | 3/2001 | Marbot et al. | 327/158 |
| 6,326,812 B1 | 12/2001 | Jefferson | |
| 6,329,850 B1 | 12/2001 | Mair et al. | |
| 6,359,814 B1 | 3/2002 | Sundarem et al. | |
| 6,667,641 B1 | 12/2003 | Wang et al. | |
| 6,836,164 B1 | 12/2004 | Wang et al. | |

OTHER PUBLICATIONS

Wolaver, Dan H., "Phase-Locked Loop Circuit Design," PTR Prentice Hall, Englewood Cliffs, New Jersey, 1991, pp. 68-70.

* cited by examiner

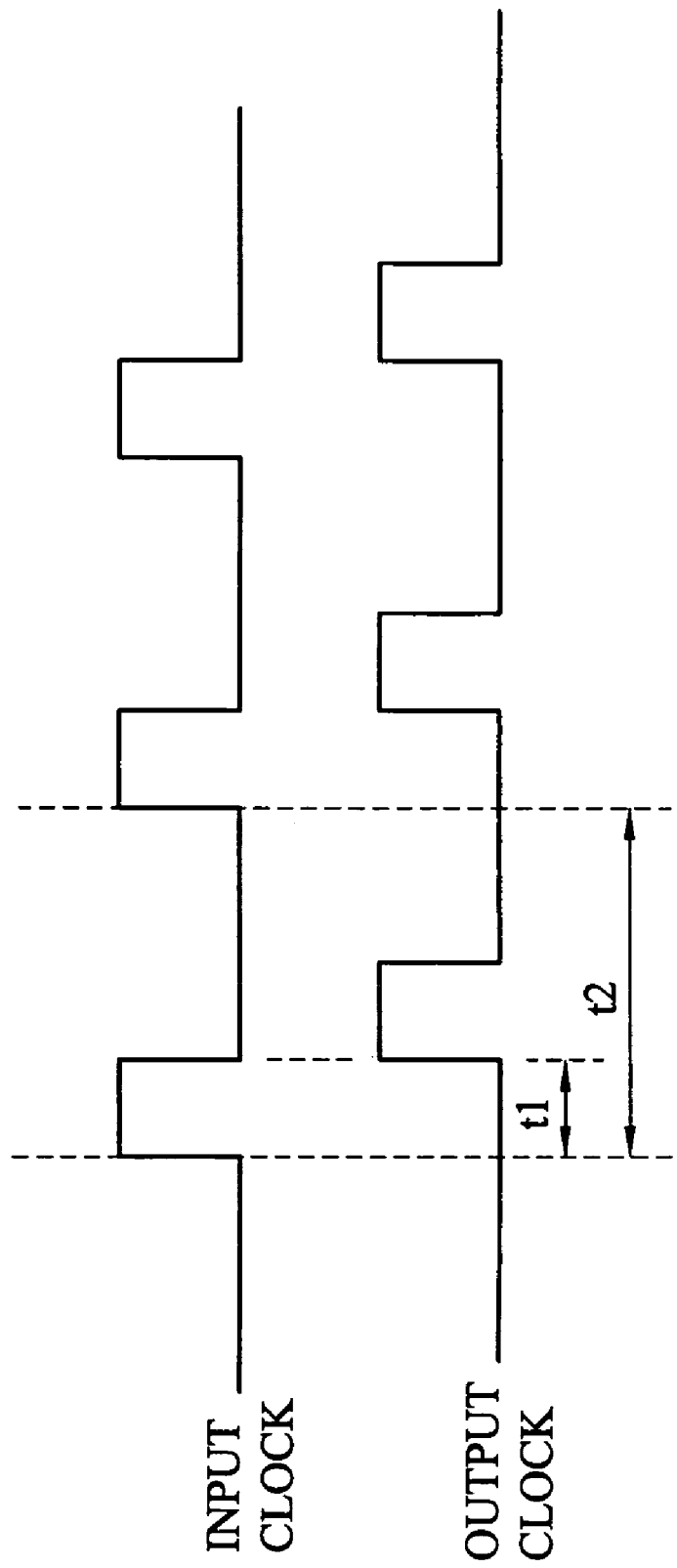

VOLTAGE, TEMPERATURE, AND PROCESS INDEPENDENT PROGRAMMABLE PHASE SHIFT FOR PLL

This application is a continuation of U.S. patent application Ser. No. 09/731,473, filed Dec. 5, 2000, now U.S. Pat. No. 6,642,758, which is a continuation-in-part of U.S. patent application Ser. No. 09/432,142, filed Nov. 2, 1999, now U.S. Pat. No. 6,369,624, which claims the benefit of U.S. provisional applications 60/169,161, filed Dec. 6, 1999; 60/106,876, filed Nov. 3, 1998; 60/107,101, filed Nov. 4, 1998; and 60/107,166, filed Nov. 5, 1998, and also claims the benefit of U.S. provisional application 60/169,161, filed Dec. 6, 1999, which are incorporated by reference along with all references cited in this application.

BACKGROUND OF THE INVENTION

The present invention relates to the field of electronic circuits, and in particular, programmable phase shift circuitry.

Many electronic systems use a master clock signal to synchronize the operation of all the circuitry and integrated circuit. A fundamental concept in electronic design, synchronous operation is important to ensure that logic operations are being performed correctly. In a system, an integrated circuit may generate its own internal clock based on the master clock signal. For example, this integrated circuit may be a microprocessor, ASIC, PLD, FPGA, or memory. The internal clock is synchronized with the master clock. And in order to ensure proper operation, it is often important to reduce skew for the internal clock of the integrated circuit.

The integrated circuit may use an on-chip clock synchronization circuit such as a phase locked loop (PLL) or delay locked loop (DLL). The synchronization circuit locks or maintains a specific phase relationship between the master clock and the internal clock. When the system is started, it is desirable that the internal clock be locked to the master clock as rapidly as possible. Under some circumstances, such as when there is a wide frequency difference between the two clock, the locking time may be slow. This is because the locking time may be dependent on the slower of the two frequencies. A slower locking time is undesirable because it will take longer for the system to initialize before normal operation. Also, as the master clock varies, it will take longer for the clock synchronization circuit to track these variations.

Therefore, techniques and circuitry are needed to address this problem of clock synchronization circuitry with slow lock acquisition times. Further, it is desirable to provide programmable phase shift selection.

SUMMARY OF THE INVENTION

The invention provides a programmable phase shift feature for a phase locked loop (PLL) or delay locked loop (DLL) circuit. The phase shift may be adjusted with equal steps. Each step may be a fixed percentage of the clock period, and will be independent of supply voltage, temperature, and process parameters. Having an on-chip PLL or DLL is an important feature in programmable logic devices (PLDs). Users can use a PLL to improve circuit performance and generate clocks with different frequencies. The phase requirement for the output clock varies depending on the application. A very useful feature for users is the ability to tune the phase of the output clock, and for the result to be independent of process, temperature, and power supply.

In an embodiment, a voltage controlled oscillator (VCO) is implemented using a ring oscillator with approximately equal delay for each stage. Other circuit implementations for a VCO may also be used, including those well known to one of skill in the art. The delay is controlled by the voltage from charge pump The number of stages in the VCO is programmable. This programmability allows a wider frequency range for the VCO. As a higher frequency as specified, a fewer number of stages are needed.

In an embodiment, there are also two counters M and K. Both counter M and counter K are programmable frequency dividers. The M counter divides the VCO clock by a ratio M, and the K counter divides the VCO clock by a ratio K. The frequency of an output clock of the PLL will be given by $F_{out}=F_{in}*M/K$. Each counter has a asynchronous preset input (or clear input) connected to an asynchronous preset input 2412. The preset input is used to initialize the circuitry.

An input clock $F_{in}$ and a feedback clock $F_{FB}$ are input into a phase detector circuit. $F_{FB}$ is generated by counter M and is the divided down clock generated by counter M. The output of the phase detector is input in the VCO, which generates a number of clock signals. One of these is selected by a multiplexer circuit to input a selected clock signal to counter M. Using the multiplexer to choose selected clock signal provides a fine adjustment feature for the phase shift provided by the circuitry. One of the clock outputs of the VCO is input to counter K. Counter K generates the output clock $F_{out}$.

In an embodiment, the invention is a phase-locked loop circuit including a voltage controlled oscillator providing a VCO clock output; a first counter having a first clock input connected to the VCO clock output; and a second counter having a second clock input connected to the VCO clock output, where the second counter generates an output clock of the phase-locked loop circuit.

Each counter may include a number of flip-flops; a number of counter logic blocks connected to the flip-flops; a number of first storage bits connected to the counter logic blocks, where the first storage bits are used to store a divider ratio for the first counter; and a number of second storage bits connected to the flip-flops, where the second storage bits are used to store an initial value for the first counter.

In another embodiment, the invention is a method of operating a phase-locked loop circuit by loading a first divider ratio in a first counter of the circuit; loading a second divider ratio in a second counter of the circuit loading a first initial value in the first counter; loading a second initial value in the second counter; and providing an output clock from the second counter having a phase difference from an input clock based on the first divider ratio, second divider ratio, first initial value, and second initial value.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIG. 17 shows a timing diagram of the input clock and output clock;

DETAILED DESCRIPTION

Figure 1:
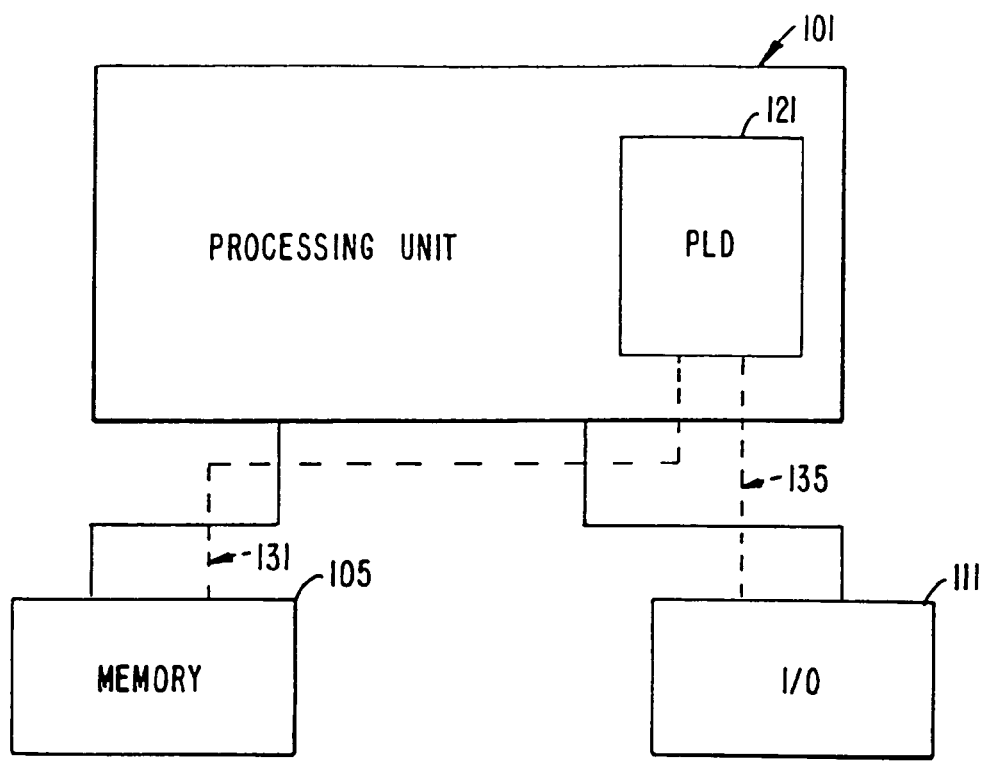
FIG. 1 is diagram of a digital system with a programmable logic integrated circuit.

FIG. 1 shows a block diagram of a digital system within which the present invention may be embodied. The system may be provided on a single board, on multiple boards, or even within multiple enclosures. FIG. 1 illustrates a system 101 in which a programmable logic device 121 may be utilized. Programmable logic devices are sometimes referred to as a PALs, PLAs, FPLAs, PLDs, CPLDs, EPLDs, EEPLDs, LCAs, or FPGAs and are well-known integrated circuits that provide the advantages of fixed integrated circuits with the flexibility of custom integrated circuits. Such devices allow a user to electrically program standard, off-the-shelf logic elements to meet a user's specific needs. See, for example, U.S. Pat. No. 4,617,479, incorporated by reference for all purposes. Programmable logic devices are currently represented by, for example, Altera's MAX®, FLEX®, and APEX™ series of PLDs. These are described in, for example, U.S. Pat. Nos. 4,871,930, 5,241,224, 5,258,668, 5,260,610, 5,260,611, 5,436,575, and the *Altera Data Book* (1999), all incorporated by reference in their entirety for all purposes. Programmable logic integrated circuits and their operation are well known to those of skill in the art.

In the particular embodiment of FIG. 1, a processing unit 101 is connected to a memory 105 and an I/O 111 and incorporates a programmable logic device (PLD) 121. PLD 121 may be specially connected to memory 105 through connection 131 and to I/O 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121 may control the logical operations of the system. In some embodiments, processing unit 101 may even be a computer system. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
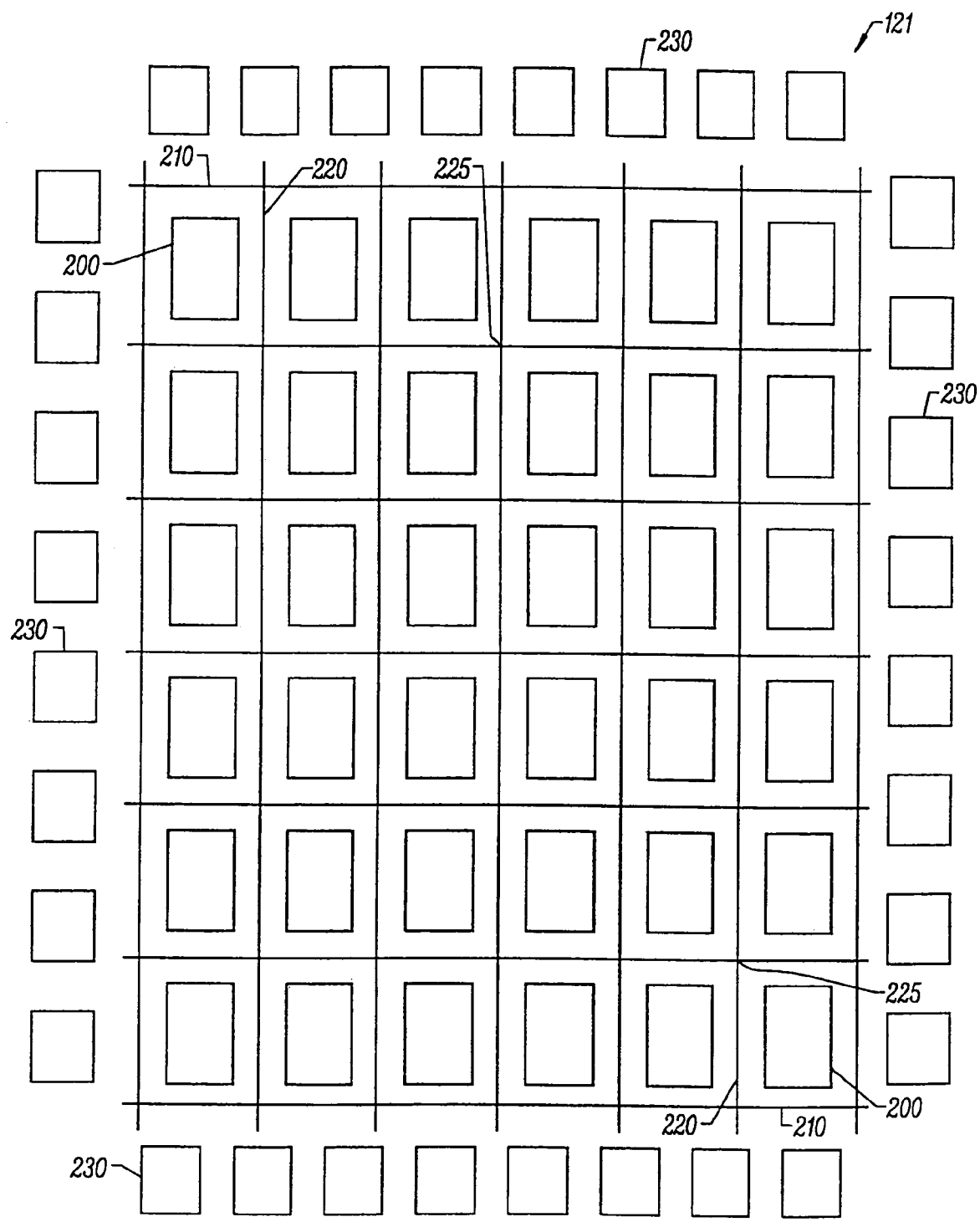
FIG. 2 is a diagram showing an architecture of a programmable logic integrated circuit.

FIG. 2 is a simplified block diagram of an overall internal architecture and organization of PLD 121 of FIG. 1. Many details of PLD architecture, organization, and circuit design are not necessary for an understanding of the present invention and such details are not shown in FIG. 2.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB will be described in more detail below in connection with FIG. 3. PLDs may contain any arbitrary number of LABs, more or less than shown in PLD 121 of FIG. 2. Generally, in the future, as technology advances and improves, programmable logic devices with greater numbers of logic array blocks will undoubtedly be created. Furthermore, LABs 200 need not be organized in a square matrix or array; for example, the array may be organized in a five-by-seven or a twenty-by-seventy matrix of LABs.

LAB 200 has inputs and outputs (not shown) which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line may represent a number of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location on PLD 121 to another LAB 200 at another location on PLD 121. A signal may pass through a number of intersections 225. Furthermore, an output signal from one LAB 200 can be directed into the inputs of one or more LABs 200. Also, using the global interconnect, signals from a LAB 200 can be fed back into the same LAB 200. In specific embodiments of the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

In other embodiments, the programmable logic integrated circuit may include special or segmented interconnect that is connected to a specific number of LABs and not necessarily an entire row or column of LABs. For example, the segmented interconnect may programmably connect two, three, four, five, or more LABs.

The PLD architecture in FIG. 2 further shows at the peripheries of the chip, input-output drivers 230. Input-output drivers 230 are for interfacing the PLD to external, off-chip circuitry. FIG. 2 shows thirty-two input-output drivers 230; however, a PLD may contain any number of input-output drivers, more or less than the number depicted. Each input-output driver 230 is configurable for use as an input driver, output driver, or bidirectional driver.

Figure 3:
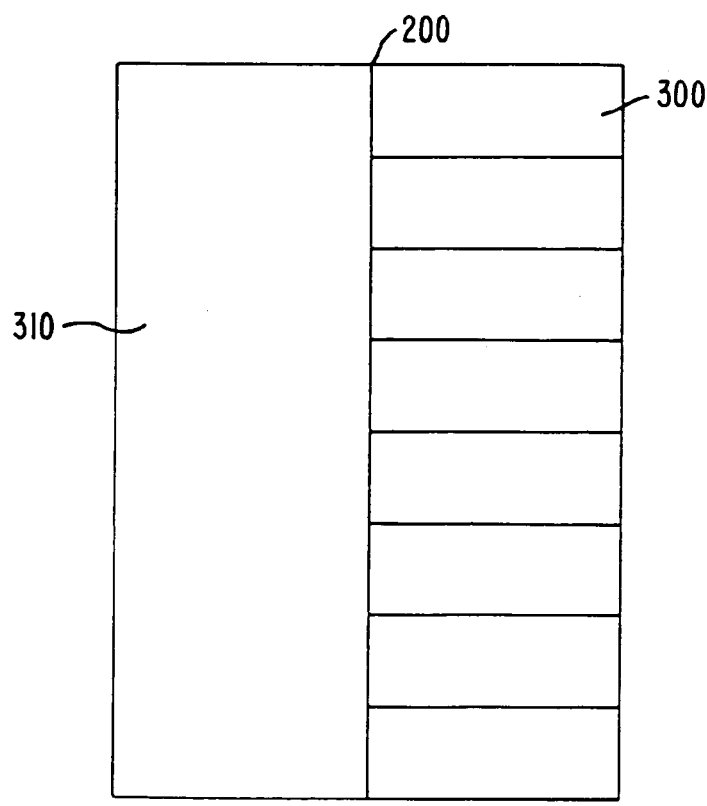
FIG. 3 is a simplified block diagram of a logic array block (LAB)

FIG. 3 shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight.

A general overview of LE 300 is presented here, sufficient to provide a basic understanding of the present invention. LE 300 is the smallest logical building block of a PLD. Signals external to the LAB, such as from GHs 210 and GVs 220, are programmably connected to LE 300 through local interconnect structure 310. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D flip-flops.

LE 300 provides combinatorial and registered outputs that are connectable to the GHs 210 and GVs 220, outside LAB 200. Furthermore, the outputs from LE 300 maybe internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220.

Figure 4A:
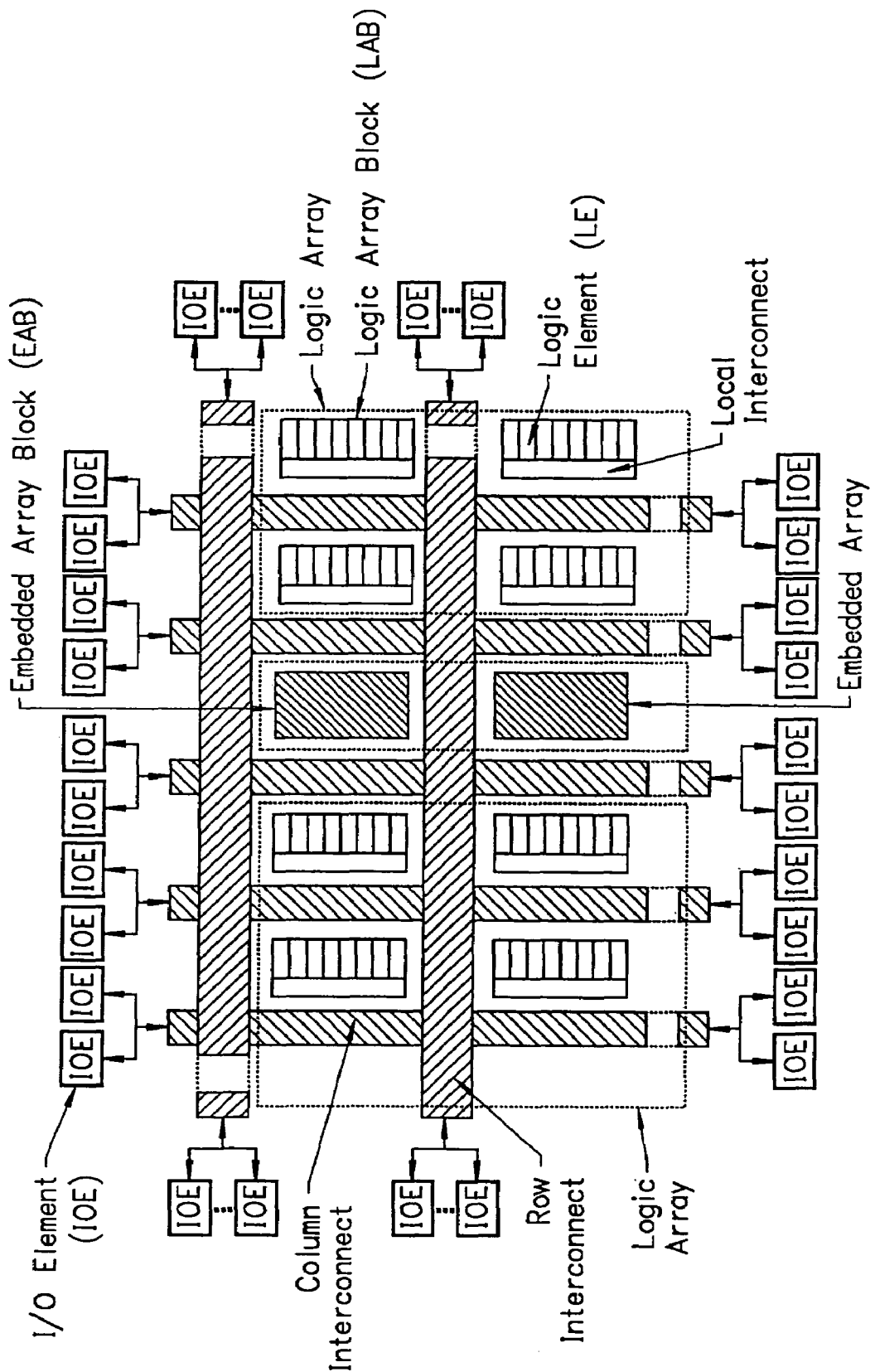
FIG. 4A shows an architecture of a programmable logic integrated circuit with embedded array blocks (EABs)

FIG. 4A shows a PLD architecture similar to that in FIG. 2. The architecture in FIG. 4A further includes embedded array blocks (EABs). EABs contain user memory, a flexible block of RAM. More discussion of this architecture may be found in the *Altera Data Book* (1999) in the description of the FLEX 10K product family and also in U.S. Pat. No. 5,550,782, which are incorporated by reference.

Figure 4B:
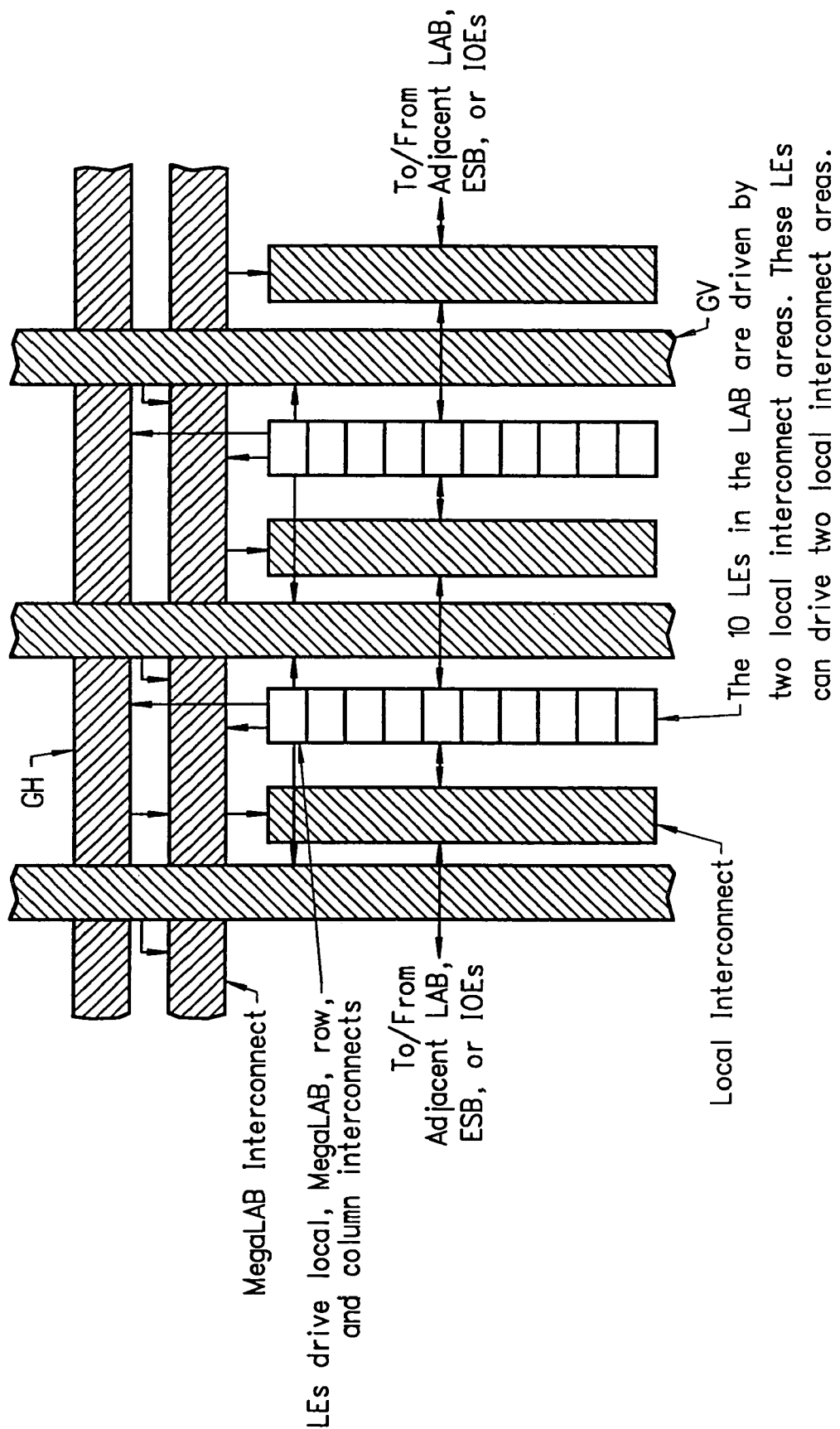
FIG. 4B shows an architecture of a programmable logic integrated circuit with megaLABs.

FIG. 4B shows a further embodiment of a programmable logic integrated circuit architecture. FIG. 4B only shows a portion of the architecture. The features shown in FIG. 4B are repeated horizontally and vertically as needed to create a PLD of any desired size. In this architecture, a number of LABs are grouped together into a megaLAB. In a specific embodiment, a megaLAB has sixteen LABs, each of which has ten LEs. There can be any number of megaLABs per PLD. A megaLAB is programmably connected using a megaLAB interconnect. This megaLAB interconnect may be considered another interconnect level that is between the global interconnect and local interconnect levels. The megaLAB interconnect can be programmably connected to GVs, GHs, and the local interconnect of each LAB of the megaLAB. Compared to the architecture of FIG. 2, this architecture has an additional level of interconnect, the megaLAB interconnect. Such an architecture is found in Altera's APEX™ family of products, which is described in detail in the *APEX 20K Programmably Logic Device Family Data Sheet* (August 1999), which is incorporated by reference. In a specific implementation, a megaLAB also includes an embedded system block (ESB) to implement a variety of memory functions such as CAM, RAM, dual-port RAM, ROM, and FIFO functions.

In an embodiment, the invention is a the PLD having a delay locked loop (DLL) or phase locked loop (PLL) circuit. DLL and PLL circuits are an important feature to minimize clock skew in such programmable integrated circuits as PLDs or FPGAs. A description of on-chip DLL and PLL circuitry for a PLD is discussed in U.S. Pat. No. 5,744,991, which is incorporated by reference. U.S. patent application Ser. No. 09/285,180, filed Mar. 23, 1999, discusses aspects of a programmable wide frequency synthesizer and is also incorporated by reference. The DLL or PLL circuitry of the PLD would include an m-state phase frequency detector circuit of the invention. In a specific case, m is an odd integer greater than three. For example, the phase detector of the invention may have five, seven, nine, eleven, thirteen, or more states. The invention is especially well suited for programmable logic integrated circuits because there may be a relatively large difference in frequencies between the reference clock and internally generated clock. A typical clock frequency range for a PLD is from about 1 megahertz to about 460 megahertz, or more. By using the m-state phase frequency detector of the invention, the circuitry will lock the phase more rapidly. The circuitry of the invention is also useful for other types of integrated circuit including microprocessors, microcontrollers, memories, DRAMs, and SRAMs.

Figure 5:
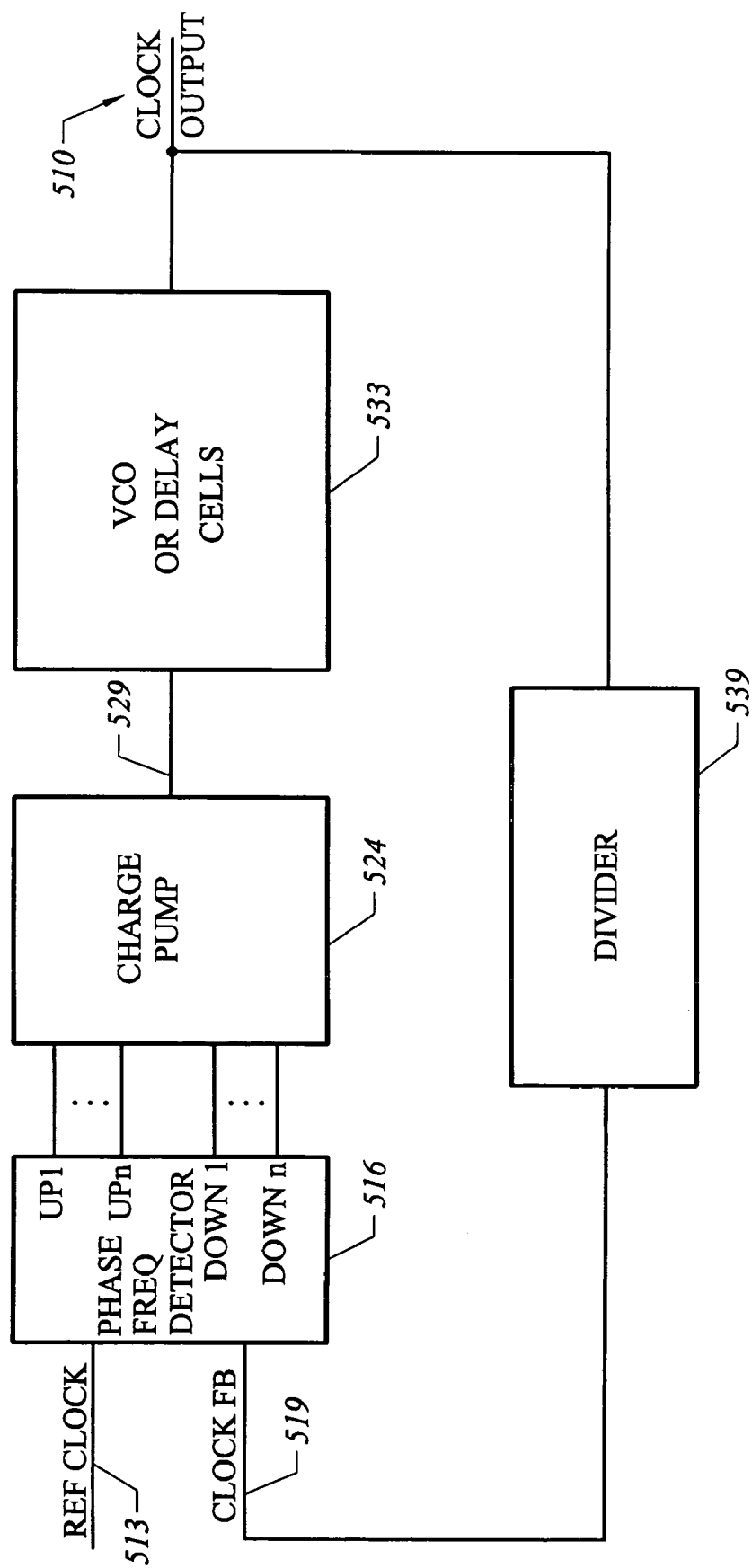
FIG. 5 shows a phase locked loop circuit.

FIG. 5 shows a phase locked loop circuit of the invention. A phase locked loop circuit is sometimes referred to as a PLL. The PLL is generally on an integrated circuit and takes as input a reference clock 513, usually from an external source. The phase locked loop circuit generates a clock output 510 that is maintained or locked in a particular phase relationship with reference clock 513. In a typical case, the clock output will be in phase with an edge of the reference clock. The clock output can also be placed in any phase relationship—such as 20 degrees out-of-phase, 60 degrees output-of-phase, 90 degrees output-of-phase,—45 degrees output-of-phase, and so forth—with respect to the reference clock. The phase relationship between the reference clock and clock output may be selected by the design or can be user specified.

In a programmable logic integrated circuit, the clock output would be directly connected or programmably connectable to the logic array blocks, embedded array blocks, configurable logic blocks, and other logical elements. For example, the clock output may be connected to the clock input of the registers or look-up tables within the logic array blocks. The clock output may be connected directly, through the programmable interconnect, through a multiplexer, or any of these to each register or other logical component of the logic array blocks, embedded array blocks, or configurable logic blocks.

The PLL will distribute clock signals with no or reduced skew. This is especially important for larger integrated circuits because there are more logical elements and the interconnections are usually longer. The programmable logic integrated circuit may have more than one PLL circuit to support multiple clock signals. In a specific embodiment, a programmable logic integrated circuit having an architecture such as shown in FIG. 4A has six independent PLL circuits. Four of these PLL circuits can be TTL PLLs, where the reference clock signal is provided using TTL input levels. The other two PLLs are low voltage differential signal (LVDS) PLLs, where the reference clock is provided using LVDS input levels.

In FIG. 5, the PLL includes a phase frequency detector (PFD) 516, which receives and compares the reference clock and a clock feedback 519. Based on this comparison, the phase frequency detector outputs UPI to UPn signals and DOWN1 to DOWNn signals to a charge pump circuit 524. For example, when the reference clock leads the feedback clock, an UP pulse is generated. When the feedback clock leads the reference clock, a DOWN pulse is generated. Based on the UP and DOWN signals, the charge pump circuit outputs a control signal 529 to adjust a voltage controlled oscillator (VCO) 533 to maintain or lock a phase relationship between the clock output and the reference clock. The VCO may be implemented using delay cells. The delay cells may be constructed using a number of buffers or inverters connected in a ring oscillator arrangement. By adjusting the control signal, the frequency of the VCO clock output 510 is adjusted. By changing the frequency, this also adjusts the phase. The clock output is fed back through a divider circuit 539, which generates clock feedback 519, to the phase frequency detector. In an embodiment, the divider circuit divides the frequency of the clock output by an amount from 1 to about 256.

The phase frequency detector is an m-state phase detector, where there will be (m−1)/2 UP and (m−1)/2 DOWN signals. For example, a three-state phase detector will have an UP and DOWN signal. A five-state phase detector will have UP1, UP2, DOWN1, and DOWN2 signals. A seven-state phase detector will have three UP and three DOWN signals. The UP signal is a pulse to adjust the charge pump in a first direction, and the DOWN signal is a pulse to adjust the charge pump in a second direction. The first direction is usually the opposite of the second direction. For example, the UP pulse may adjust the phase of the VCO output clock in a positive direction in relation to the reference clock edge, and the DOWN will adjust the VCC output clock in a negative direction. By providing a series of UP and DOWN signals, the phase relationship between the clock and reference clock is maintained.

An m-state phase frequency detector of the invention may also be used in a DLL circuit. The phase frequency detector could be incorporated into a DLL circuit in a similar fashion as it is incorporated into a PLL circuit. The techniques and circuitry of the invention can be applied to phase detector circuits and frequency detector circuits.

The PLL circuitry of the invention will lock more quickly because the phase frequency detector reacts more quickly to phase differences by generating UP and DOWN signals more frequently. A three-state phase detector circuit is slower than similar circuitry having five or more states because the circuitry must reset to the initial state before there can be a pulse. A five-state phase frequency detector will lock at least as quickly as a three-state phase frequency detector. In the typical case, a five-state phase detector will lock or align the phase of the clock about twice as fast as a three-state phase detector. For a clock frequency range from 1 megahertz to 460 megahertz, the five-state phase frequency detector will lock the phase up to twice as fast as a three-state phase detector. A five-state phase frequency detector generates two pulses for every one pulse of a three-state phase frequency detector. It will generally take longer for the PLL circuitry to lock at lower frequencies because the circuitry is operating more slowly. At lower frequencies, a five-state phase detector will be faster than a three-state phase detector.

Figure 6:
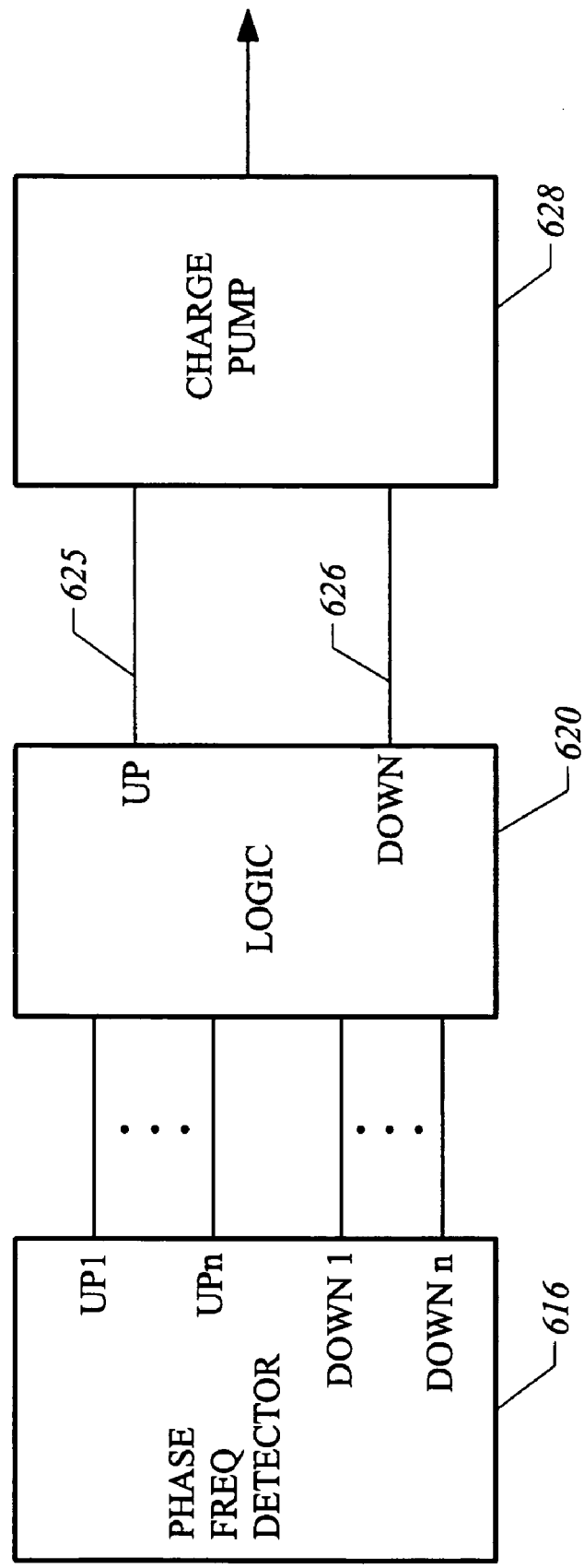
FIG. 6 shows a portion of another implementation of a the phase locked loop circuit.

For an m-state phase detector, where m is greater than three, the UPI to UPn signals can be combined and treated as a single UP signal by the charge pump. And, the DOWN1 to DOWNn signals are combined and treated as a single DOWN signal by the charge pump. As shown in FIG. 6, there is logic 620 to combine the UPn and DOWNn signals into a single UP signal 625 and DOWN signal 626. The UP and DOWN signals will be input to the charge pump 628. By using logic 620, similar charge pump circuitry as used for a three-state phase detector can be used for the m-state phase detector. The logic may be separate from the phase frequency detector circuitry, part of the phase frequency detector circuitry, or part of the charge pump circuitry.

Figure 7:
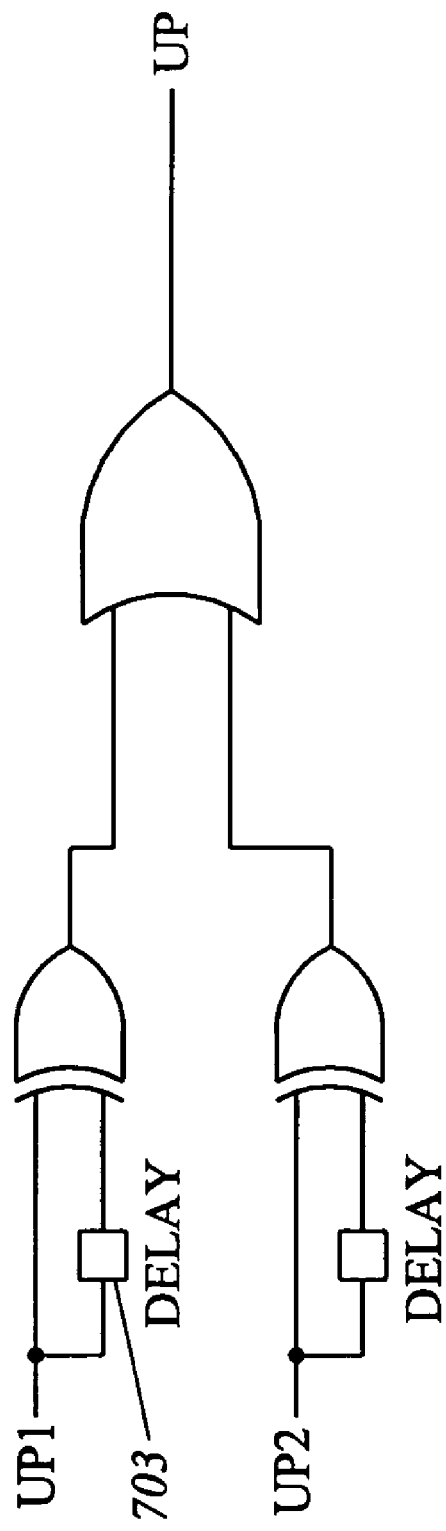
FIG. 7 shows circuitry to generate a single UP signal from UP1 and UP2 signals.

FIG. 7 shows circuitry than can be used to implement logic 620 for the UP signals. Similar circuitry can be used for the DOWN signals. UP1 and a delayed version of the UP1 (as a result of delay block 703) are input into an exclusive OR gate. Delay block 703 provides a delay from its input to its output. Delay block 703 may be implemented using a chain of inverters. There are many other techniques to implement a delay block in an integrated circuit, and any of these techniques may be used. The output of the XOR gate is input to an OR gate. There are similar XOR gate circuits for each of the n UP signals. The output of the OR gate is UP, which will pulse every time there is a pulse on any of the UPI to UPn inputs. Delay 703 makes the pulse from the XOR gate have a constant width, which will be based on the length of the delay provided by delay block 703. To make the pulse widths from all the XOR gates the same, the length of delay 703 for each of the UP branches should be the same.

The figure shows only one implementation of the logic. As one of skill in logic design understands, there are many other ways to implement the same logical function using different types of gates and circuitry. For example, the circuity may use pass gates, transmission gates, NAND gates, NOR gates, inverters, AND gates, and other gates in substitution for the XOR and OR gates shown.

Figure 8:
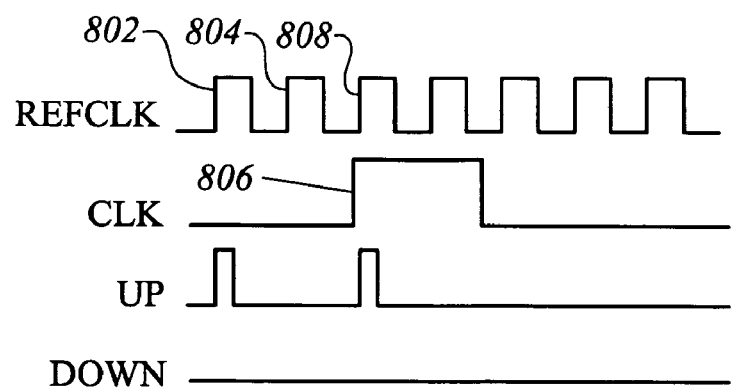
FIG. 8 shows a timing diagram for a three-state phase frequency detector.
Figure 9:
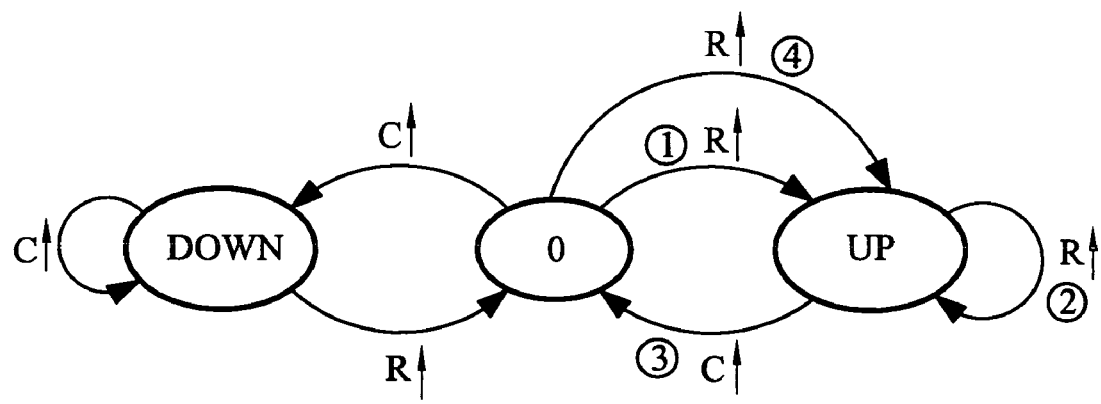
FIG. 9 shows a state diagram for a three-state phase frequency detector.

FIG. 8 shows timing diagrams for an example of the operation of a three-state phase frequency detector. FIG. 9 shows a state diagram for a three-state phase frequency detector. When entering an UP or DOWN state, the circuitry will generate an UP or DOWN pulse, respectively. When exiting or remaining in the UP or DOWN state, no pulse is generated.

For FIG. 8, assuming the circuitry starts in the 0 state, since the reference clock leads the clock at time 802, the circuitry goes to the UP state and generates a pulse. This is represented by the arrow labeled with a circled 1 in FIG. 9. At time 804, the reference clock leads the clock. The circuitry will remain in the UP state; no pulse is generated.

This is represented by the arrow labeled with a circled 2 in FIG. 9. At time 806, the clock leads the reference clock, so the circuitry resets or exits the UP state to return to the 0 state. No pulse is generated. This is represented by the arrow labeled with a circled 3 in FIG. 9. At time 808, the reference clock leads the clock, and the circuitry goes to the UP state. A pulse is generated. This is represented by the arrow labeled, with a circled 4 in FIG. 9.

Figure 10:
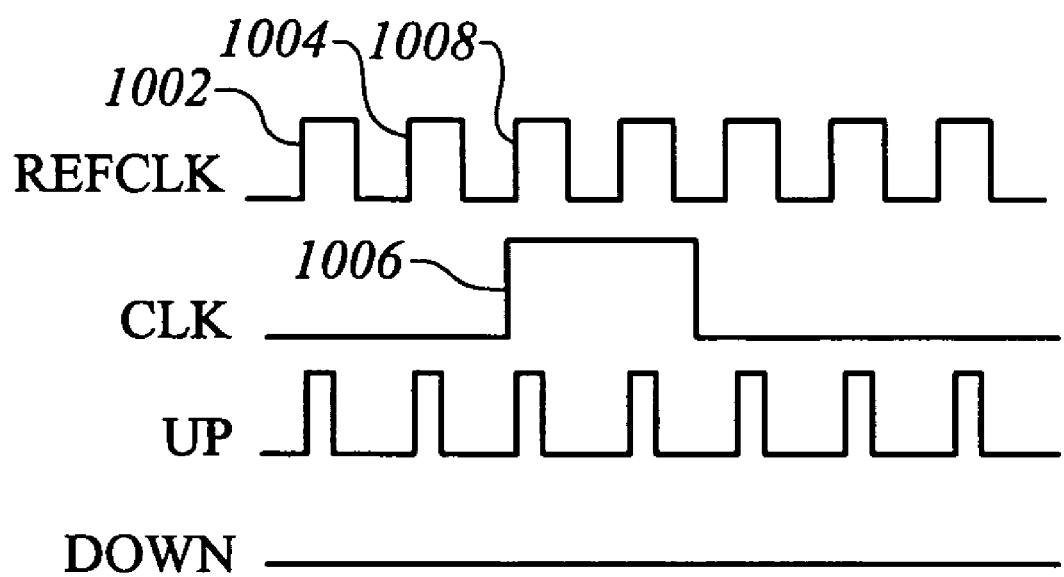
FIG. 10 shows a timing diagram for an m-state phase frequency detector.
Figure 11:
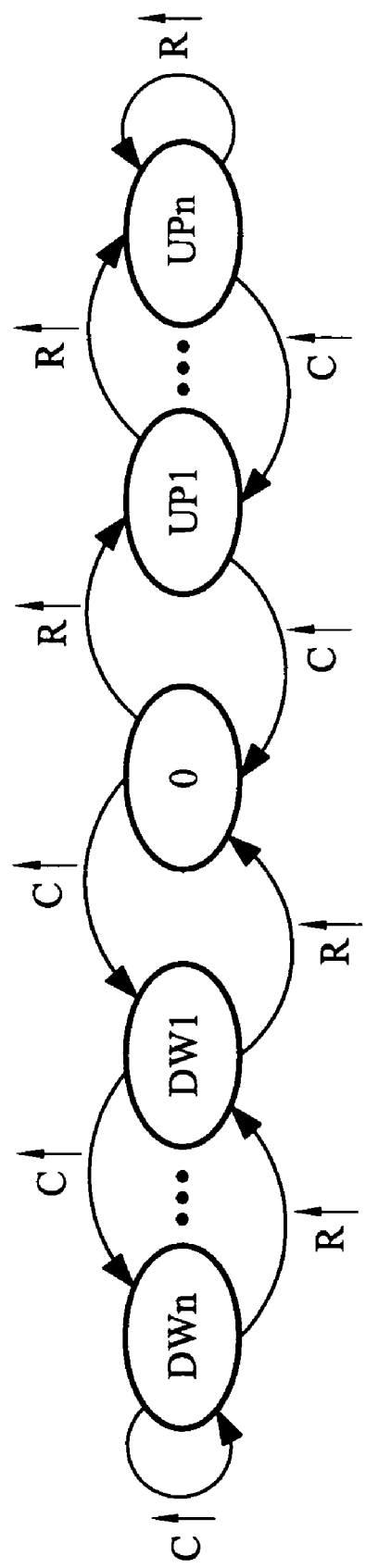
FIG. 11 shows a state diagram for an m-state phase frequency detector.

FIG. 10 shows a timing diagram for the same reference clock and clock inputs as FIG. 8, but the phase frequency detector has m states. FIG. 11 shows a state diagram for an m-state phase frequency detector. Although shown as operating based on rising clock edges, the circuitry could also be easily modified to operate based on falling clock edges. The phase detector is initially at state 0. It goes to state UP1 if the reference clock or REFCLK rising edge comes first. It returns to state 0 when the next rising edge is the VCO clock or CLK. If the next rising edge is CLK again, it goes to DW1 or DOWN1. Operation continues in this fashion moving from state to state as indicated in FIG. 11. For an m-state phase frequency detector, m is equal to 2*n+1.

The m-state phase frequency detector generates UP or DOWN pulses based on both the phase error and frequency difference of the two input clocks, REFCLK and CLK. If the frequency of REFCLK is several times faster than CLK, multiple UP pulses will be generated. If the frequency of the CLK is several times faster than the REFCLK, then multiple DOWN pulses will be generated. When it is in state 0, it generates no pulses. When in state UPI, it generates one up pulse. In state UPn, it generates m UP pulses, if the state machine stays at UPn, then no extra UP pulse is generated regardless of extra REFCLK rising edges. In state DOWN1, it generates one DOWN pulse. In state DOWNn, it generates n DOWN pulses. Similarly, if the state machine stays at DOWNn, then no extra down pulse is generated regardless of extra CLK rising edges.

For FIG. 10, the phase frequency detector receives and detects a string of rising edges of the reference clock before it sees a rising edge of the clock. A maximum of (m−1)/2 up pulses are generated, where m is the number of states. Assuming the circuitry starts in the 0 state, since the reference clock leads the clock at time 1002, the circuitry goes to the UP1 state and generates an UP pulse. At time 1004, the reference clock leads the clock. The circuitry will go to the UP2 state and generates another UP pulse. At time 1006, the clock leads the reference clock, so the circuitry resets or exits the UP2 state to return to the UPI state. No pulse is generated. This is represented by the arrow labeled with a circled 3 in FIG. 11. At time 1008, the reference clock leads the clock, and the circuitry goes to the UP2 state. An UP pulse is generated. UP pulses continue to be generated as shown in FIG. 10 according to the state diagram of FIG. 11.

The three-state phase detector generates UP and DOWN pulses based on the phase delay between the two input clocks, reference clock and VCO clock (i.e., clock signal generated by the VCO). When the two clock frequencies are sufficiently or significantly different, the frequencies of the UP and DOWN pulses the phase detector generates will be determined by the slower of the two clock frequencies. This means the frequency of the UP and DOWN pulses will be at about the same frequency as the slower clock. In FIG. 8, the UP pulses were generated at about the frequency of the VCO clock signal. Compared to the m-state phase frequency detector of FIG. 10, a disadvantage of this phase detector implementation is that it has slow lock time when the VCO has wide frequency range, especially with low reference clock frequencies. Slow lock time refers to the time it takes for the circuitry receiving the up and down signals to "lock" on to the appropriate valve.

Therefore, the m-state phase and frequency detector of the invention can overcome the disadvantage of a three-state phase detector by generating UP and DOWN pulses that are determined by the faster clock input to the phase detector. The resulting phase and frequency detector will have more sensitivity to the frequency difference between the reference clock and VCO clock. Hence, it will have a faster lock time when the reference clock and VCO clock natural frequencies are sufficiently or significantly different. In FIG. 10, note the higher frequency at which UP pulses are generated as compared to that in FIG. 8.

Figure 12:
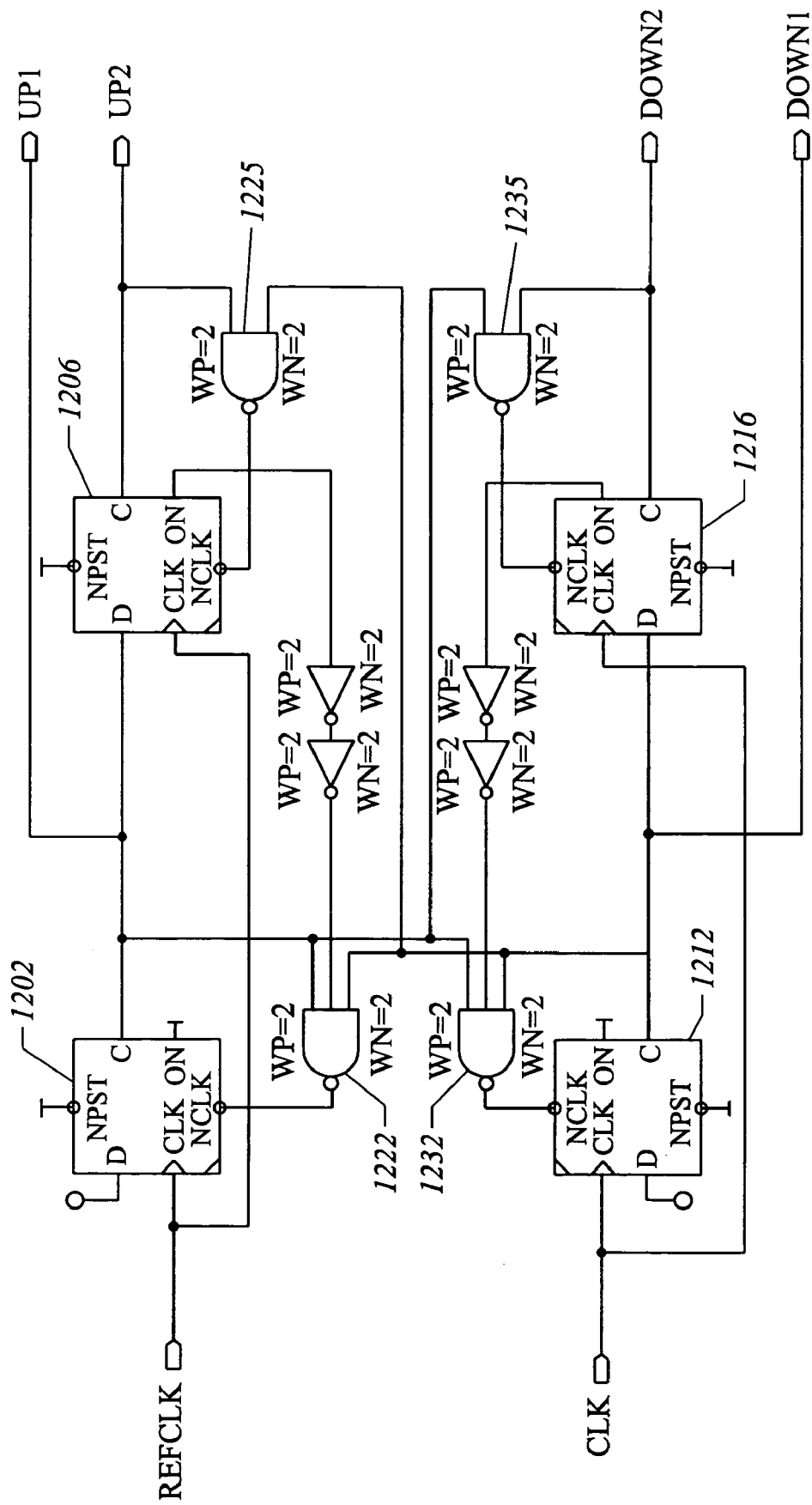
FIG. 12 shows a circuit diagram for a five-state phase frequency detector.
Figure 13:
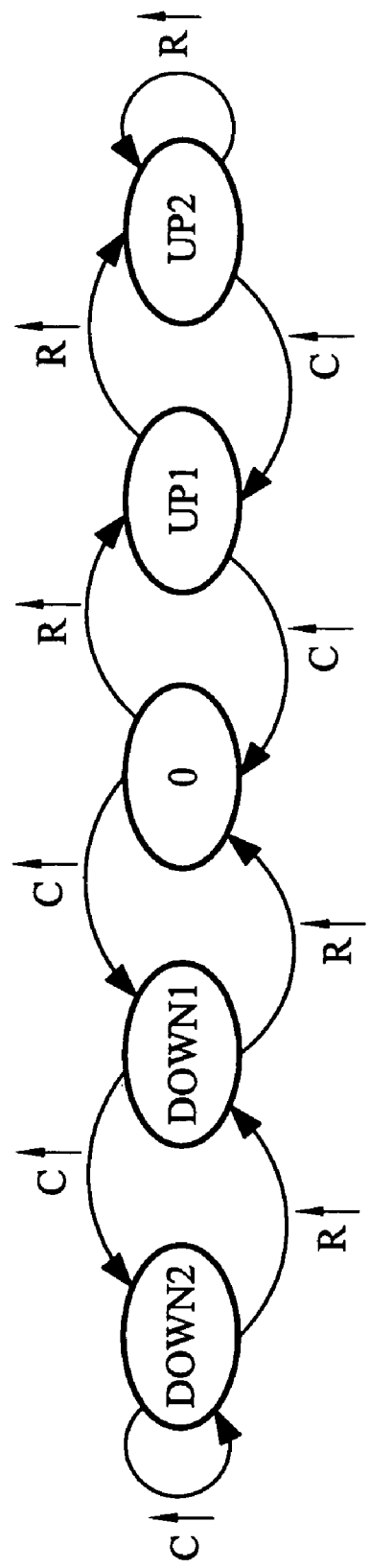
FIG. 13 shows a state diagram for a five-state phase frequency detector.

FIG. 12 shows a circuit implementation of a five-state phase frequency detector. FIG. 13 shows a state diagram for the operation of this detector circuit. The phase detector circuit of the invention may however have more than five states; for example, the circuitry may have seven, nine, eleven, thirteen, or more states. Similar circuitry and techniques may be used to implement a detector for m-states. There are two inputs, REFCLK and CLK. There are four outputs, UP1, UP2, DOWN1, and DOWN2. When the REFCLK rising edge occurs, UP1 goes high. UP2 goes high if the next clock rising edge is still REFCLK. UP2 will go low when the CLK rising edge comes, and so on. The pulse width of UP1, UP2, DOWN1, and DOWN2 can be limited to certain maximum widths using for example the XOR and delay block circuitry of FIG. 7.

REFCLK is connected to a clock input of a D-register 1202 and a D-register 1206. A D input of register 1202 is connected to VCC or VDD, which is a logic 1 input. A Q output of register 1202 outputs UPI. The Q output of register 1202 is connected to a D input of register 1206. A Q output of register 1206 outputs UP2.

CLK is connected to a clock input of a D-register 1212 and a D-register 1216. A D input of register 1212 is connected to VCC or VDD, which is a logic 1 input. A Q output of register 1212 outputs DOWN1. The Q output of register 1212 is connected to a D input of register 1216. A Q output of register 1216 outputs DOWN1.

Although the circuitry in this figure used D-type registers, other types of storage circuits and blocks may also be used. For example, instead of D-type registers, the circuitry may be implemented using latches and flip-flops including J-K, S-R, T, and other types of flip-flops. The D-registers in the circuit have an NPST input, an active low preset input. The NPST function is not used. Therefore, NPST inputs are connected to VCC or VDD to disable the function. Registers without an NPST input may also be used.

An output of NAND gate 1222 is connected to an NCLR input, an active low clear input, of register 1202. Inputs to NAND gate 1222 are UP1, a QN output (inverted Q, Q bar output, or /UP2) of register 1206, and DOWN1. The QN output from register 1206 is buffered and delayed using two inverters. The two inverters are used so that at the time register 1206 is reset, register 1202 is not reset. It is desirable that the registers are reset one at a time, so that registers 1206 and 1202 are not reset at the same time. This will enable proper operation of the state machine. An output of NAND gate 1225 is connected to an NCLR input of register 1206. Inputs to NAND gate 1225 are connected to UP2 and DOWN1. An output of NAND gate 1232 is connected to an NCLR input of register 1212. Inputs to NAND gate 1232 are UPI, a QN output (inverted Q, Q bar, or /DOWN2) of register 1216, and DOWN1. The QN output from register 1216 is buffered and delayed using two inverters. The two inverters are used so that at the time register 1216 is reset, register 1212 is not reset. It is desirable that the registers are reset one at a time, so that registers 1216 and 1212 are not reset at the same time. This will enable proper operation of the state machine. An output of NAND gate 1235 is connected to an NCLR input of register 1216. Inputs to NAND gate 1235 are connected to UP1 and DOWN2.

In this implementation, the logic gates are NAND gates. Other types of logic gates and logic elements may be used in other implementations of the invention. For example, NOR, AND, OR, pass gates, look-up tables, and other logical structures may also be used. A three-input NAND gate may be implemented using two two-input NAND gates.

The operation of the circuitry is shown by the state diagram of FIG. 13. Starting the initial or 0 state, the UP1, UP2, DOWN1, and DOWN2 outputs of FIG. 12 are 0. Upon a REFCLK edge, the circuit will enter the UP1 state, and the UP1 output becomes 1. While in the UP1 state, upon another REFCLK edge, the circuit will enter the UP2 state, and the UP2 output becomes 1 while the UP1 output becomes 0. While in the UP1 state, upon a CLK edge, the circuit will return to the 0 state. The UP1 and UP2 outputs will be reset to 0. When in the UP2 state, upon a CLK edge, the circuit will return to the UP1 state. The UP1 and UP2 outputs will be 0. When in the UP2 state, upon a REFCLK edge, the circuit will remain in the UP2 state. The UP1 and UP2 outputs will be 0.

When in the 0 state, upon a CLK edge, the circuit will go to DOWN1 state, and the DOWN1 output will be 1. When in the DOWN1 state, upon another CLK edge, the circuit will enter the DOWN2 state, and the DOWN2 output becomes 1 while the DOWN1 output becomes 0. While in the DOWN1 state, upon a REFCLK edge, the circuit will return to the 0 state. The DOWNI and DOWN2 outputs will be reset to 0. When in the DOWN2 state, upon a REFCLK edge, the circuit will return to the DOWN1 state. The DOWN1 and DOWN2 outputs will be 0. When in the DOWN2 state, upon a CLK edge, the circuit will remain in the DOWN2 state. The DOWN1 and DOWN2 outputs will be 0.

The UP1 and UP2 outputs will typically be connected to an OR gate that outputs a unified, or combined UP signal, which will pulse when either UP1 or UP2 pulses. Similarly, DOWN1 and DOWN2 outputs will typically be connected to an OR gate that outputs a unified or combined DOWN signal, which will pulse when either DOWN1 or DOWN2 pulses. Also, these outputs may be made to have a maximum or specific pulse width by using circuitry similar to what is shown in FIG. 7.

Figure 14:
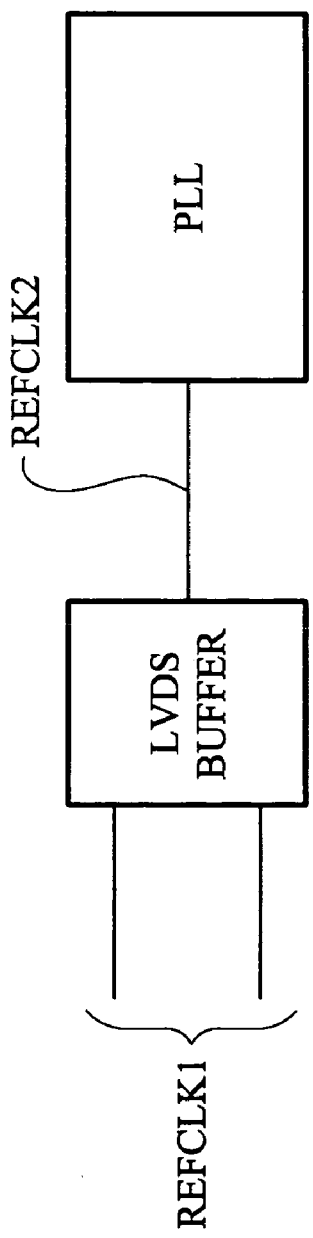
FIG. 14 shows a LVDS buffer and phase locked loop circuit.

FIG. 14 shows an embodiment of the invention where an LVDS buffer is connected between a REFCLK1, provided using LVDS levels, and the PLL circuitry. The LVDS buffer converts the REFCLKI to REFCLK2 which is a reference clock signal that is CMOS compatible. The LVDS buffer may include comparator circuitry to detect and compare its inputs.

LVDS is an emerging standard, and there is currently no single standard. In one implementation of LVDS, there are two input lines. A voltage difference between the two lines is about 200 millivolts, and a center voltage for the lines is about 1.2 volts. One logical state is represented by having 1.1 volts on the first line and 1.3 volts on the second line. The other logical state is represented by having 1.3 volts on the first line and 1.1 volts on the second line. Since LVDS has as a relatively small voltage swing, very high speed switching is permitted with less EMI noise.

The PLL circuit uses a CMOS-compatible clock input. So, the LVDS buffer converts the LVDS signal to CMOS compatible range. REFCLK2 will be in the range of 0 to VDD or VCC, which is typical of CMOS signals.

Figure 15:
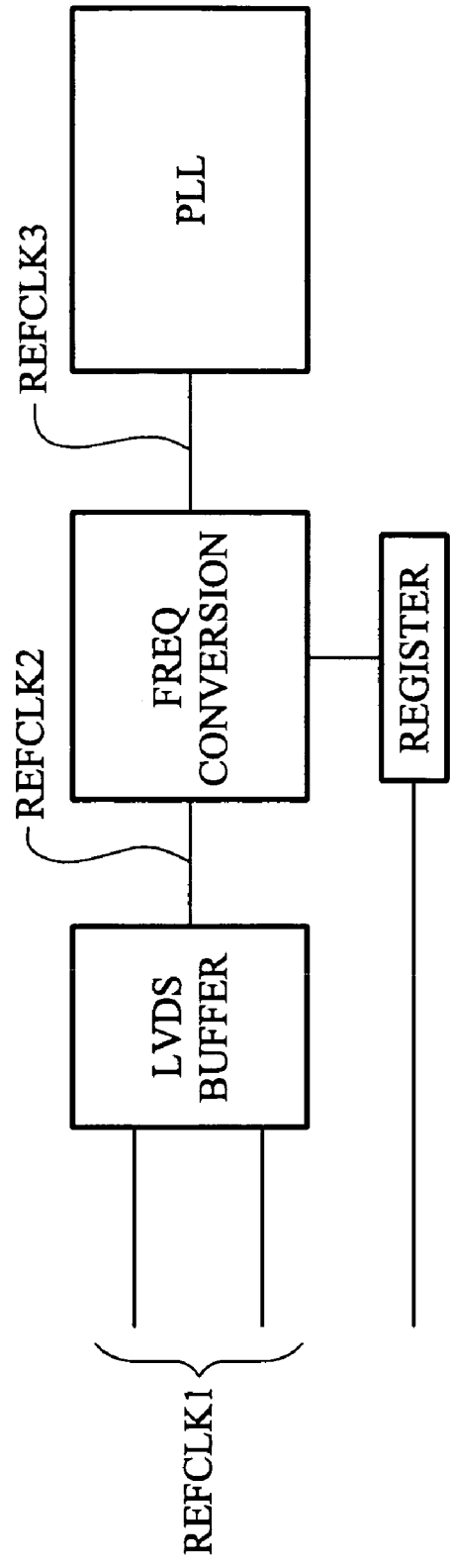
FIG. 15 shows a LVDS buffer, frequency conversion circuit, and phase locked loop circuit.

FIG. 15 shows the addition of a frequency conversion circuit to modify the frequency of the REFCLK1. Sometimes the LVDS clock signal is at a very high frequency that the PLL circuitry cannot handle directly. The frequency conversion circuit generates REFCLK3, which is at a reduced frequency. The amount to divide down the clock frequency can be selected by a value stored in a register. This value can be selected and input by the user in parallel or serial to the register.

Figure 16A:
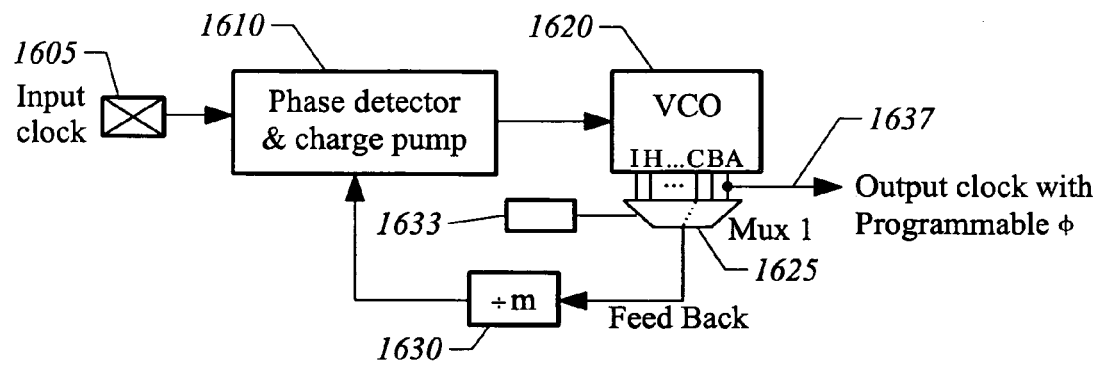
FIG. 16A shows a PLL circuit with a programmable phase shift feature.

FIG. 16A shows a PLL circuit with a programmable phase shift feature. This circuitry permits the user to programmably select a certain phase shift between the output clock and the input (or reference or external) clock. This feature provides flexibility for the user of integrated circuits, especially for programmable logic integrated circuits. For example, the user may programmably select from a 0 to 100 percent (e.g., 30 percent, 45 percent, 60 percent, 75 percent, 90 percent, or any other percentage) phase shift between the output clock and input clock.

FIG. 17 shows a timing diagram of the input clock and output clock. The input clock and output clock may be at the same frequency or at different frequencies. The period of the input clock is t2. The time of the phase difference between the input clock and output clock is t1. The percentage of phase shift is given by (t1/t2)*100. In an embodiment of the invention, the amount of phase shift is programmably selectable.

Returning to FIG. 16A, the input or reference clock 1605 is connected to phase detector and charge pump circuitry 1610. The phase detector and charge pump are lumped into a single block for this figure. The m-state phase detector circuit discussed above may be used in circuitry 1610 to speed up the phase lock time. The charge pump is connected to the VCO 1620. The VCO includes a number of delay stages. Each of the delay stages will be connected to the charge pump. The delay stages are connected to a multiplexer 1625. In this embodiment, the VCO has outputs A through I. However, there can be any number of delay stages in the VCO. The output clock 1637 of the VCO is taken from stage A. If inverting delay stages are used, the number of stages should be odd in order to form an oscillator (for a single ended VCO implementation). The VCO, for example, may have any number of stages from 1 to 501 or more stages. In specific implementations, there are 3 stages, 5 stages, 7 stages, 9 stages, 15 stages, 65 stages, or 111 stages.

Figure 16B:
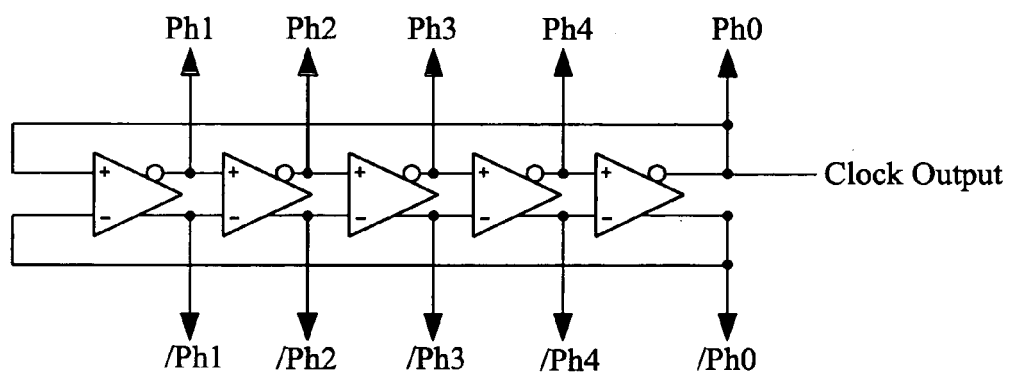
FIG. 16B shows a differential VCO circuit.

The specific number of VCO stages is dependent on the circuit implementation. The higher VCO frequency required, the smaller number of the VCO stages needed. Other types of VCO design are possible. An example is a differential stage VCO. The differential VCO can have even or odd numbers of stages, while the single-ended inverter string type of VCO can only have odd numbers of stages. If the differential VCO is used, both ends of the output can be connected to multiplexer 1625 to achieve finer resolution of programmable phase shift (without increasing the VCO stage numbers, which is a function of required frequency). In a specific embodiment, the programmable phase shift circuit uses a differential VCO. FIG. 16B shows an example of a differential VCO circuit. FIG. 16B is an example of the ring oscillator type of VCO using five differential stages. Notice that both ends of the output can be connected to multiplexer 1625. There are five stages and ten outputs.

Multiplexer 1625 programmably selects which of the delay stage outputs is fed back through the frequency divider 1630 to the phase detector. A configuration RAM 1633, programmable cells (e.g., EEPROM or Flash cells), register, latch, flip-flop, or other storage means may be used to control the programmable selection of the multiplexer. The storage means will hold the control bits. Depending on which of the delay stage outputs (e.g., A through I) is fed back, there will be a phase different between the input and output clocks. In one embodiment, the user inputs a number of bits into the configuration RAM. Based on these bits, the multiplexer will pass the VCO stage output corresponding to those bits to the phase detector.

The multiplexer selects one of the delay stages to feed back to the phase detector. For example, if there are 256 or fewer stages, then 8 control bits can be used to decode and select the appropriate output. The minimum number of control bits will be given by $\log_2 n$, where n is the number of stages. U.S. Pat. No. 5,815,024, which is incorporated by reference, shows various circuits and techniques of decoding multiple bits onto a single output, and any of these techniques may be used in the implementation of the multiplexer.

Figure 18:
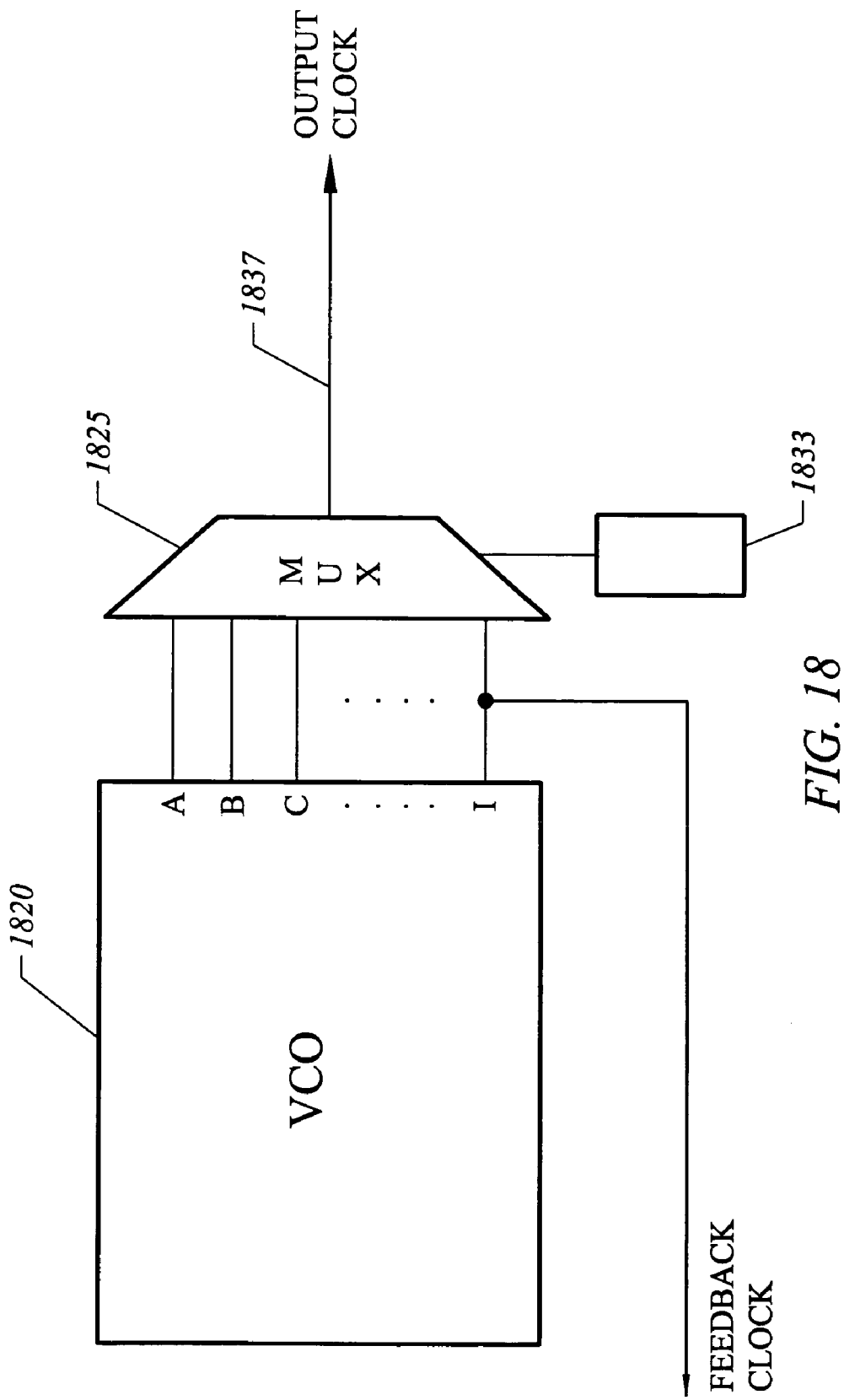
FIG. 18 shows another embodiment of a PLL circuit with a programmable phase shift feature.

The phase shift between input and output clocks is controlled by the phase difference between the delay stage output used for the output clock 1637 and the delay stage that is fed back to the phase detector. It should be noted the output clock may be taken from any of the delay stages. FIG. 16A shows a technique where the phase shift is selected by fixing the output clock at stage A, and programmably selecting which delay stage output to feed back. An alternative technique is to select the phase shift by fixing the delay stage output which is fed back, and then programmably selecting which delay stage output will be used as the output clock. An example of this alternative technique is that stage A is fed back, and a multiplexer like multiplexer 1625 is used to select which delay stage to use as the output clock. FIG. 18 shows an example of this embodiment. A multiplexer 1825 selects as an output clock 1837 one of the clock oscillator outputs from the VCO. A storage block 1833, analogous to 1633, holds the user's phase offset selection. One of the VCO outputs is fed back to the phase detector (not shown). In FIG. 18, output I is used as the feedback clock.

The phase shift can be adjusted with an amount of precision that is based on the number of stages in the VCO. Generally, the more delay stages, the finer the steps of phase shift will be available. If the output clock 1637 is stage A and the stage A output is also used as the feedback clock, there will be no phase shift between the input clock and the output clock. If there are j delay stages, each stage will provide an 1/j phase shift.

Figure 19:
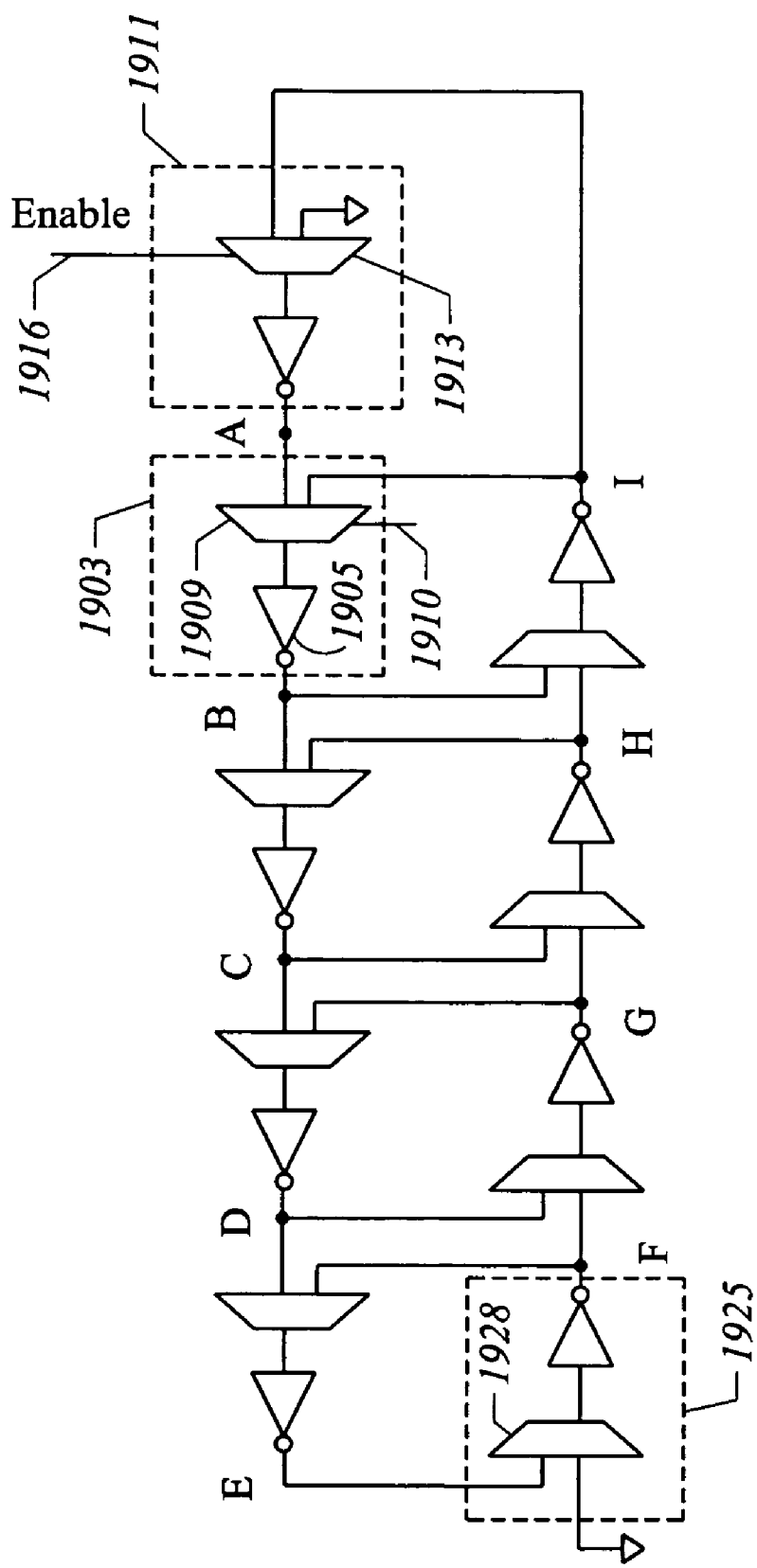
FIG. 19 shows a more detailed diagram of a VCO.

FIG. 19 shows a diagram of an embodiment of a voltage controlled oscillator, which may be used for VCO 1620 or 1820. Each stage or cell 1903 (between nodes A and B) includes a delay buffer 1905 and multiplexer 1909, which may be an inverting buffer. Multiplexer 1909 has an enable 1910 that controls whether the delay stage is enabled or disabled to increase or decrease the number of stages in the VCO. There is a delay stage between each of the nodes A through I. This embodiment has eight similar stages. The stages need not be identical or the same. However, in an embodiment of the invention, the stages are designed to be the same or as similar as possible in order to ensure a precise delay of each stage. A precise delay will improve the precision with which the phase adjustment can be programmably controlled. In an embodiment, the layout of the delay stages cell is the same or similar. For example, the device sizes of the transistors used to form the multiplexer and delay buffer will be the same. The interconnect lengths and widths between the stages will be the same.

In stage 1903, the multiplexer is connected to nodes A and I. The delay buffer outputs to node B. A stage 1911 is connected between nodes A and I. A multiplexer 1913 has an enable input 1916 that is used to enable or disable the VCO. When disabled, the VCO will not oscillate and power is conserved. Multiplexer 1913 is connected to node I and ground or VSS. In a stage 1925 connected between nodes E and F, a multiplexer 1928 is connected to node E and ground.

Figure 20:
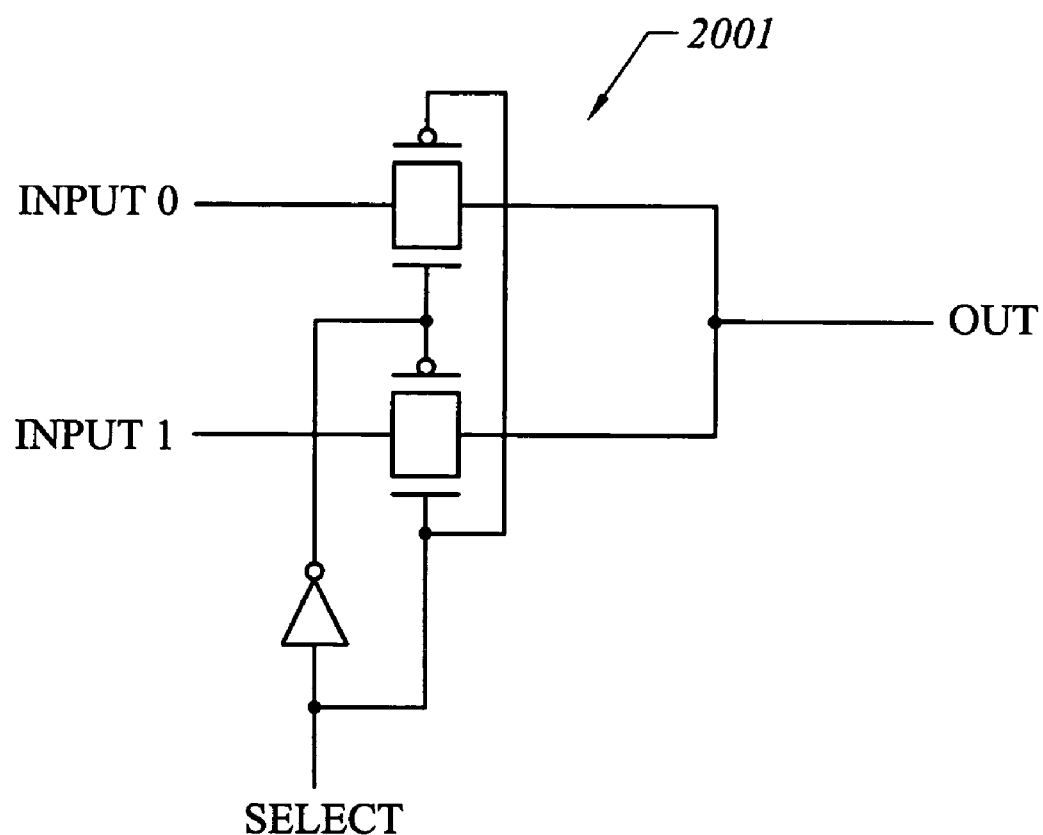
FIG. 20 shows a multiplexer circuit.

FIG. 20 shows a schematic for a multiplexer circuit 2001 which may be used in the implementation of the VCO in FIG. 19. The multiplexer has an INPUT 0, INPUT 1, SELECT input, and an OUT output. Based on SELECT, INPUT 0 or INPUT 1 will be passed to OUT. This multiplexer circuit is constructed using transmission gates or fully complementary CMOS pass gates. There are many other multiplexer circuit configurations that may be used in the VCO. For example, the multiplexer may be designed using logic gates like NAND, NOR, AND, OR, and INVERT.

Figure 21:
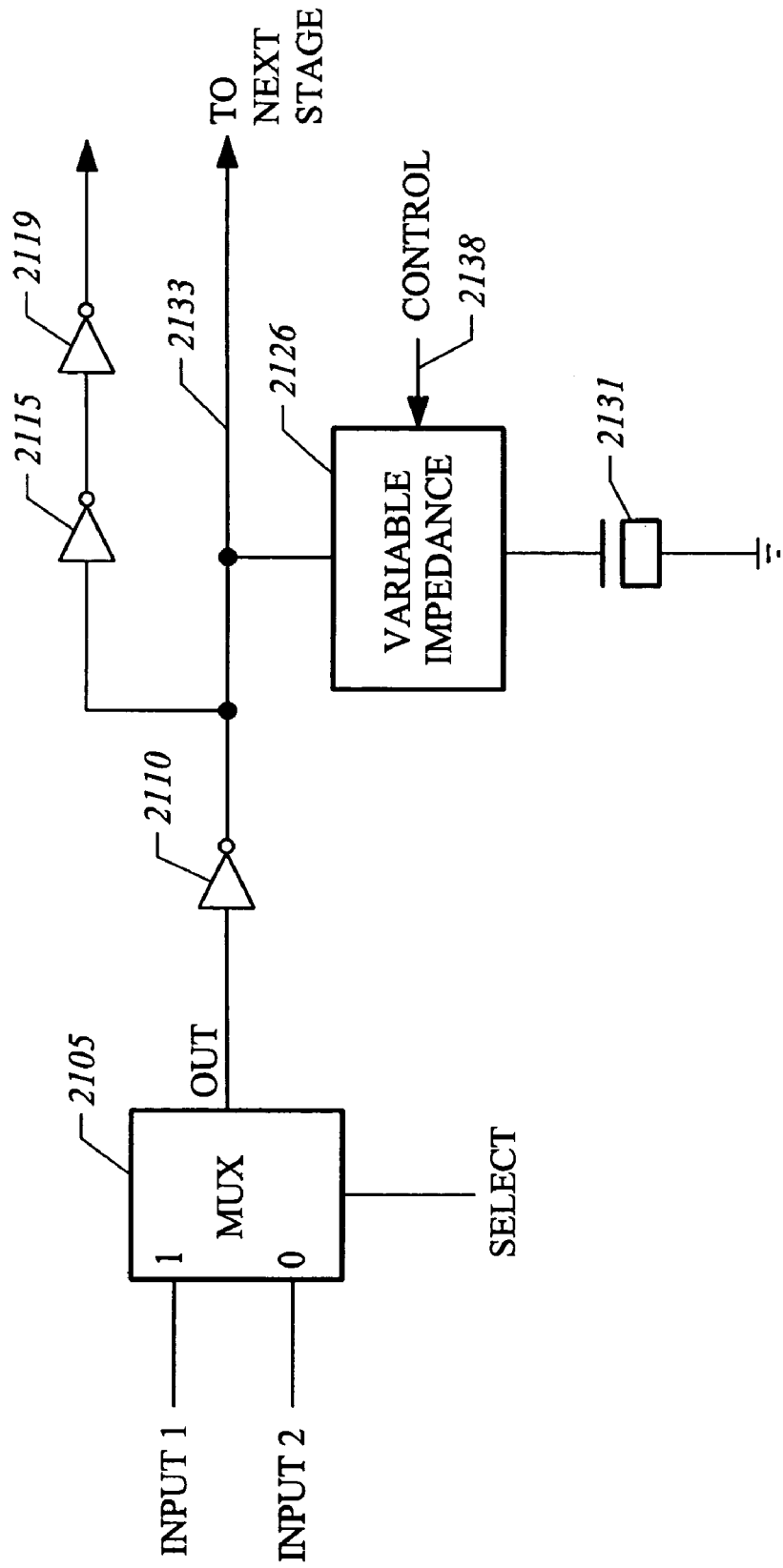
FIG. 21 shows an implementation of a delay stage.

FIG. 21 shows a more detailed diagram of a delay cell circuit that may be used in the VCO of FIG. 19. A multiplexer 2105 outputs into an inverter circuit 2110, which is in turn connected to two inverters 2115 and 2119 in sequence. An output of inverter 2119 is the delay stage's output, which will be connected to multiplexer 1625 to drive the feedback line. The inverters can be CMOS inverters or other types of implementations of an inverter. At an output of 2110 is a variable impedance 2126. The variable impedance is in series with a capacitance 2131 connected to ground. In the implementation in FIG. 21, capacitance 2131 is formed using a MOS transistors. However, any technique of creating a capacitance on an integrated circuit may be used to form capacitance 2131. Output 2133 is logically the same as the output of inverter 2119. Inverter 2119 is a big driver to handle more capacitive load, i.e., to drive multiplexer 1625 and the feedback line. The 2133 output is used "locally," i.e., to drive the next stage of the VCO.

Variable impedance 2126 provides a variable impedance at node 2133 based on control 2138. The impedance or resistance of variable impedance 2126 can be varied to give a resistance of variation with several orders of magnitude. For example, the variable impedance may be varied in one embodiment to have a value in a range from almost zero impedance to almost infinite impedance. By varying the impedance of variable impedance 2126 by way of control 2138, the amount of capacitance seen at node 2133 is varied. With greater capacitance at node 2133, there would be greater delay because there is a bigger capacitive load for inverter 2110 to drive. With less capacitance at node 2133, the delay would be less since there is less of a capacitive load for inverter 2110 to drive. Therefore, in a VCO with stages like that one in FIG. 21, by varying control 2138 of each stage, the frequency of the VCO is changed.

Figure 22:
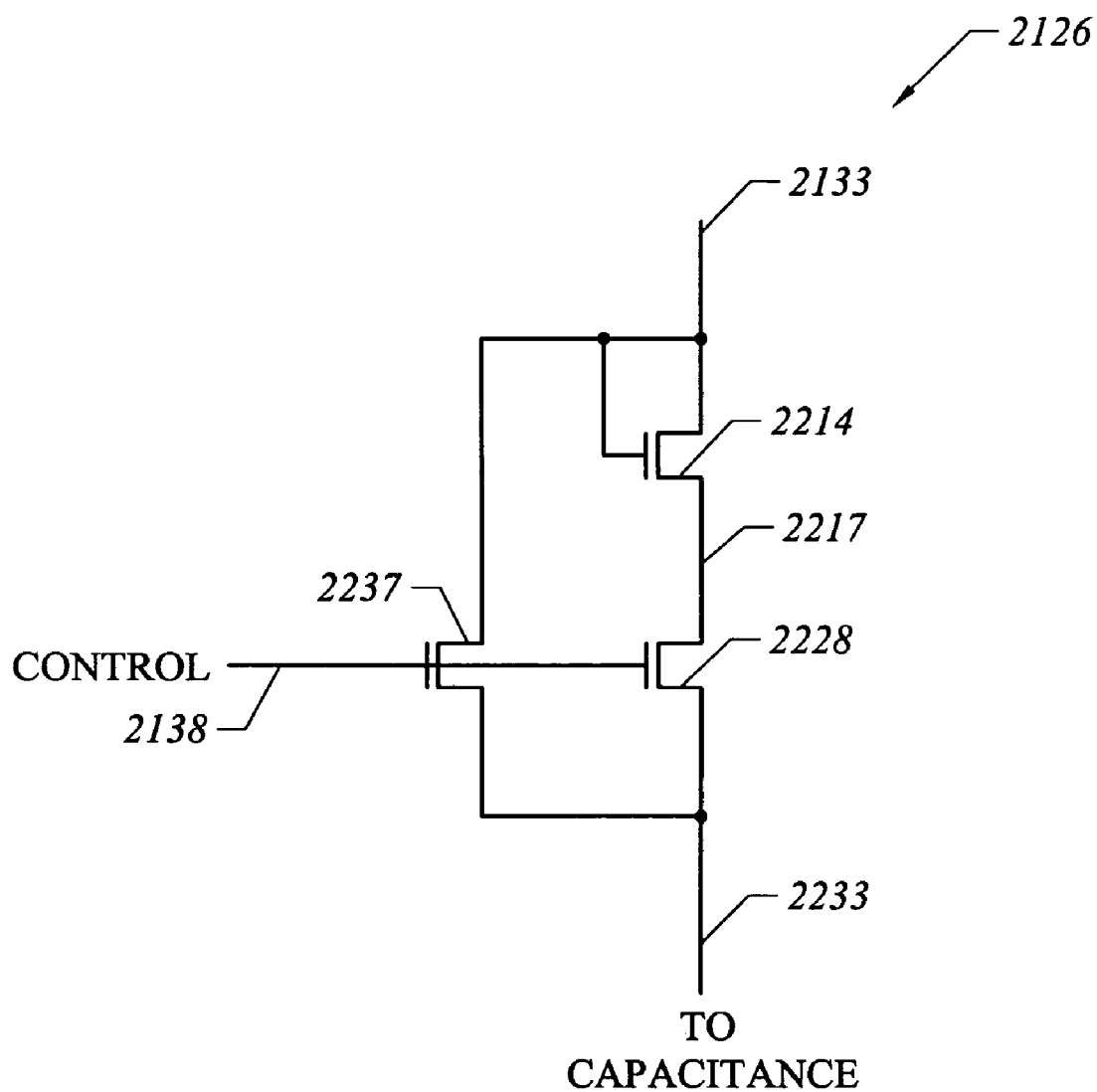
FIG. 22 shows a variable impedance circuit.

FIG. 22 shows an implementation of a variable impedance 2126. There are other techniques of creating a variable impedance and any of these techniques may be used. For example, a variable impedance may be created by using a single MOS transistor. In FIG. 22, a transistor 2214 is connected by node 2133 and a node 2217. A transistor 2228 is connected between nodes 2217 and 2233. A transistor 2237 is connected between nodes 2133 and 2233. In this implementation, the transistors are NMOS transistors. The variable impedance could also be been designed using PMOS transistor and other types of transistors and devices.

Gates of transistors 2237 and 2228 are connected to control 2138, which is used to vary the impedance. Transistor 2214 is diode-connected, having its gate connected to node 2133 (its source). Node 2233 is connected to the capacitance or capacitor.

By varying a voltage at control 2138, the impedance between nodes 2133 and 2233 will also vary. The voltage at control 2138 typically ranges from VDD to VSS. When control is VSS, there will be essentially a very high impedance (which may be a tristate state), ignoring any leakage current, because transistors 2237 and 2228 are off. In a particular embodiment, the voltage at control 2138 varies from about zero volts to about 1.8 volts. Some advantages of the circuitry in FIG. 22 include that the voltage controlled resistor exhibits a relatively large range of resistance variation by a small control voltage change. There are also relatively few transistors used to implement the circuitry.

Figure 23:
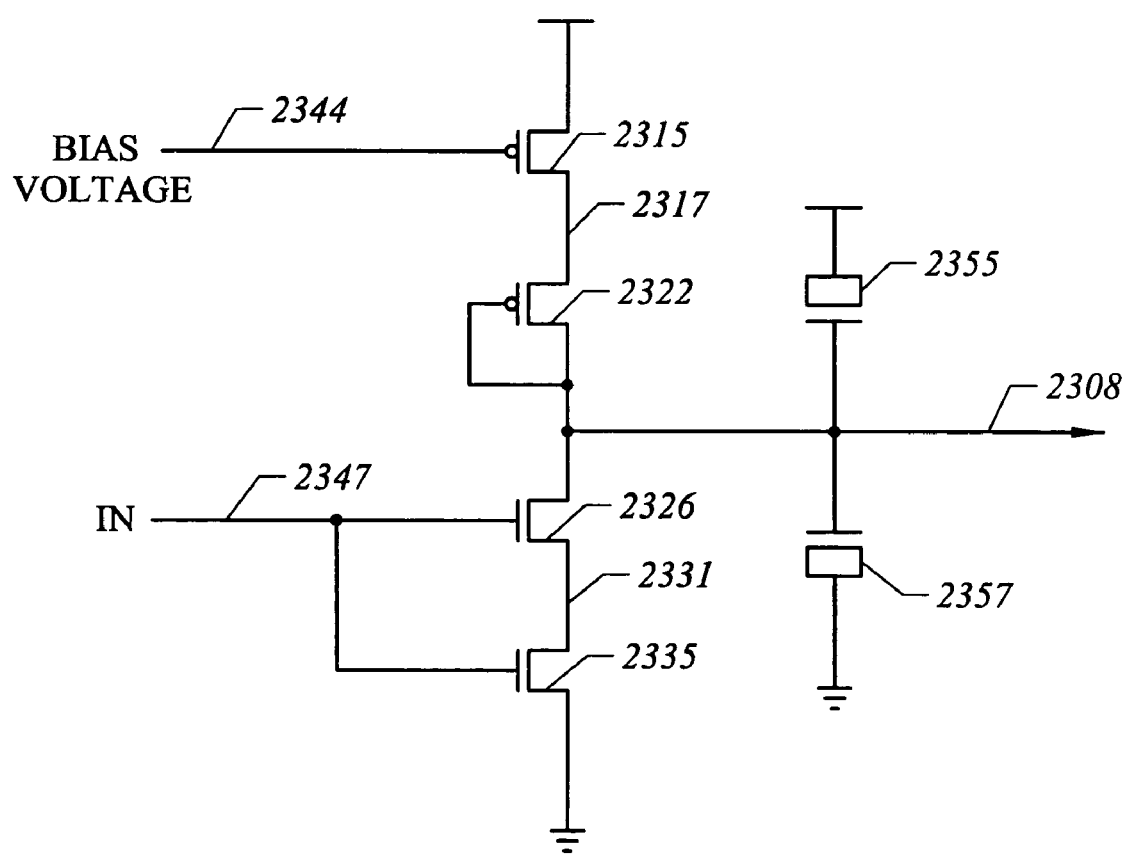
FIG. 23 shows a level shift circuit for generating a control voltage for the VCO.

FIG. 23 shows a level shift circuit to interface between the charge pump and the VCO control circuit. The charge pump output typically has an analog output that varies from about VT to about VDD-VT, where VT is a threshold voltage of a MOS transistor. In a specific embodiment, the level shift circuit of FIG. 23 shifts the charge pump output to a voltage range between about VSS and about VDD. In other words, the level shift circuit shifts the charge pump output to an appropriate voltage range that is more or most effective for the VCO control circuit. The level shifted charge pump control voltage is generated and provided at node 2308, which is in turn connected to node 2138. In the circuit, a transistor 2315 is connected between VDD and node 2317. A transistor 2322 is connected between 2317 and 2308. A transistor 2326 is connected between 2308 and 2331. A transistor 2335 is connected between 2331 and VDD. In this specific implementation, transistors 2315 and 2322 are PMOS while transistors 2326 and 2336 are NMOS. A gate of transistor 2315 is connected to a bias voltage 2344. Transistors 2322 is diode connected, where its gate is connected to node 2308. Gates of transistors 2326 and 2335 are connected to an IN input 2347. The voltage at IN varies, which varies the output voltage at 2308. Capacitances 2355 and 2357 are connected at node 2308. These capacitances help provide AC stabilization at node 2308 to fluctuations in the VDD and VSS voltages.

An aspect of the invention is a technique to achieve programmable phase shift locked loop (PLL). The phase of the PLL output can be adjusted with equal steps. Each step is a fixed percentage of the clock period and independent of supply voltage, temperature, and process. The techniques of this invention are also applicable to delay locked loops (DLLs).

PLL or DLL circuitry has become an important part of PLDs. U.S. Pat. No. 5,590,305 discusses a programmable logic integrated circuit with clock synchronization circuitry and is incorporated by reference. The clock synchronization circuitry may be a PLL or DLL, or a combination of the two or other circuits. A PLL or DLL is used for two main reasons: (a) to synchronize the internal clock with an external clock, and (b) to synthesize the internal clock at a different rate of the external clock. The phase requirement for output clock varies with the application. It is very useful for the users if they can tune the phase of the output clock, and the result will be independent of process, temperature and power supply. Some techniques for implementing a PLL are discussed in U.S. patent application Ser. Nos. 09/432, 442 and 09/432,142, both filed Nov. 2, 1999, which are incorporated by reference.

Figure 24:
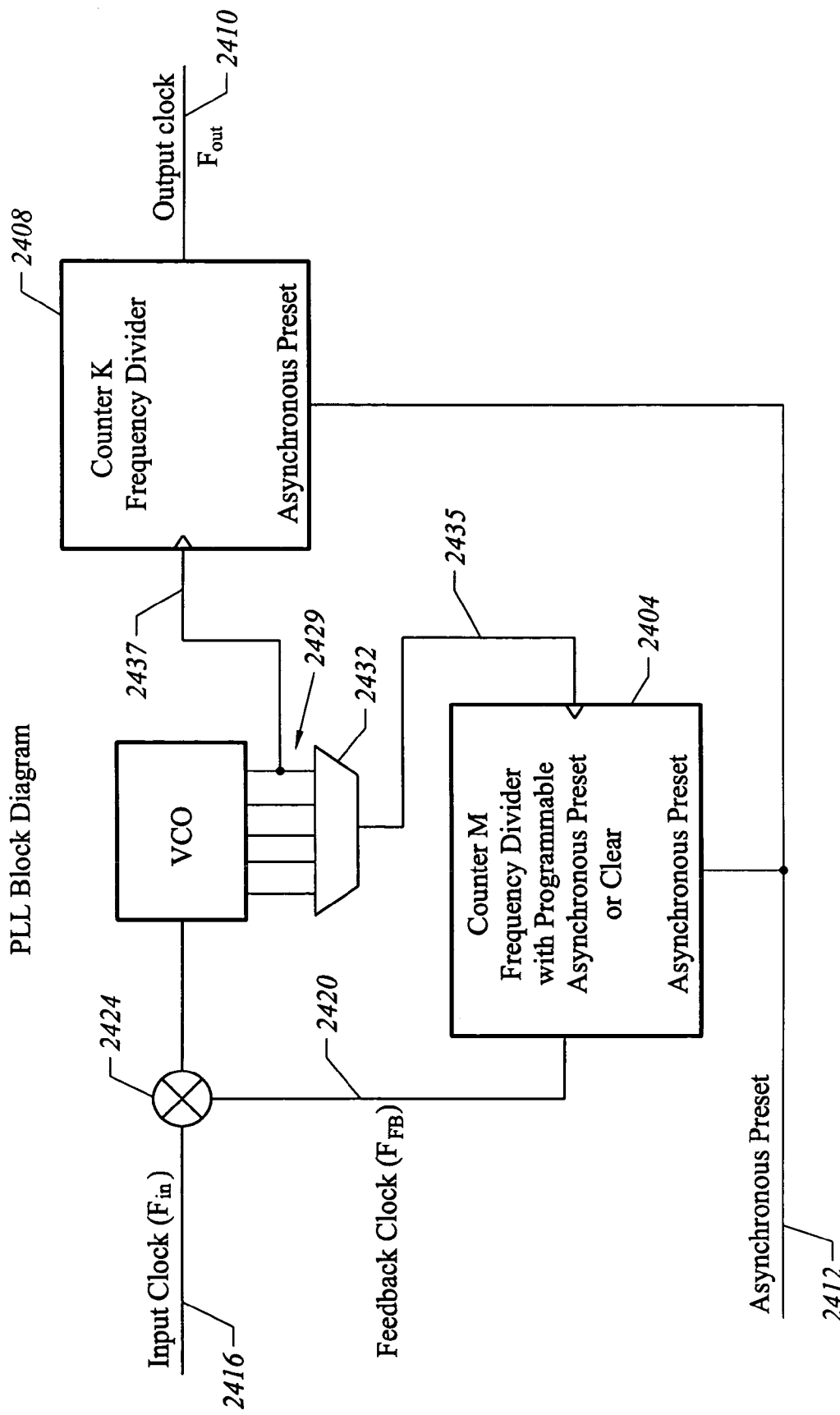
FIG. 24 shows a another embodiment of a PLL circuit with a programmable phase shift feature.

FIG. 24 shows the block diagram of a PLL with programmable phase shift circuitry. There are two counters, M 2404 and K 2408. In this embodiment, both counter M and counter K are programmable frequency dividers. The M counter divides the VCO clock by a ratio M, and the K counter divides the VCO clock by a ratio K. The frequency of output clock 2410 will be given by $F_{out}=F_{in}*M/K$. In FIG. 24, each counter has a asynchronous preset input (or clear input) connected to an asynchronous preset input 2412. The preset input is used to initialize the circuitry.

An input clock $F_{in}$ 2416 and a feedback clock $F_{FB}$ 2420 are input into a phase detector circuit 2424. $F_{FB}$ is generated by counter M and is the divided down clock generated by counter M. The output of the phase detector is input in the VCO, which generates a number of clock signals 2429. One of these is selected by a multiplexer circuit 2432 to input a selected clock signal 2435 to counter M. Using the multiplexer to choose selected clock signal 2435 provides a fine adjustment feature for the phase shift provided by the circuitry. One of the clock outputs 2437 of the VCO is input to counter K 2408. Counter K generates the output clock $F_{out}$.

Figure 25:
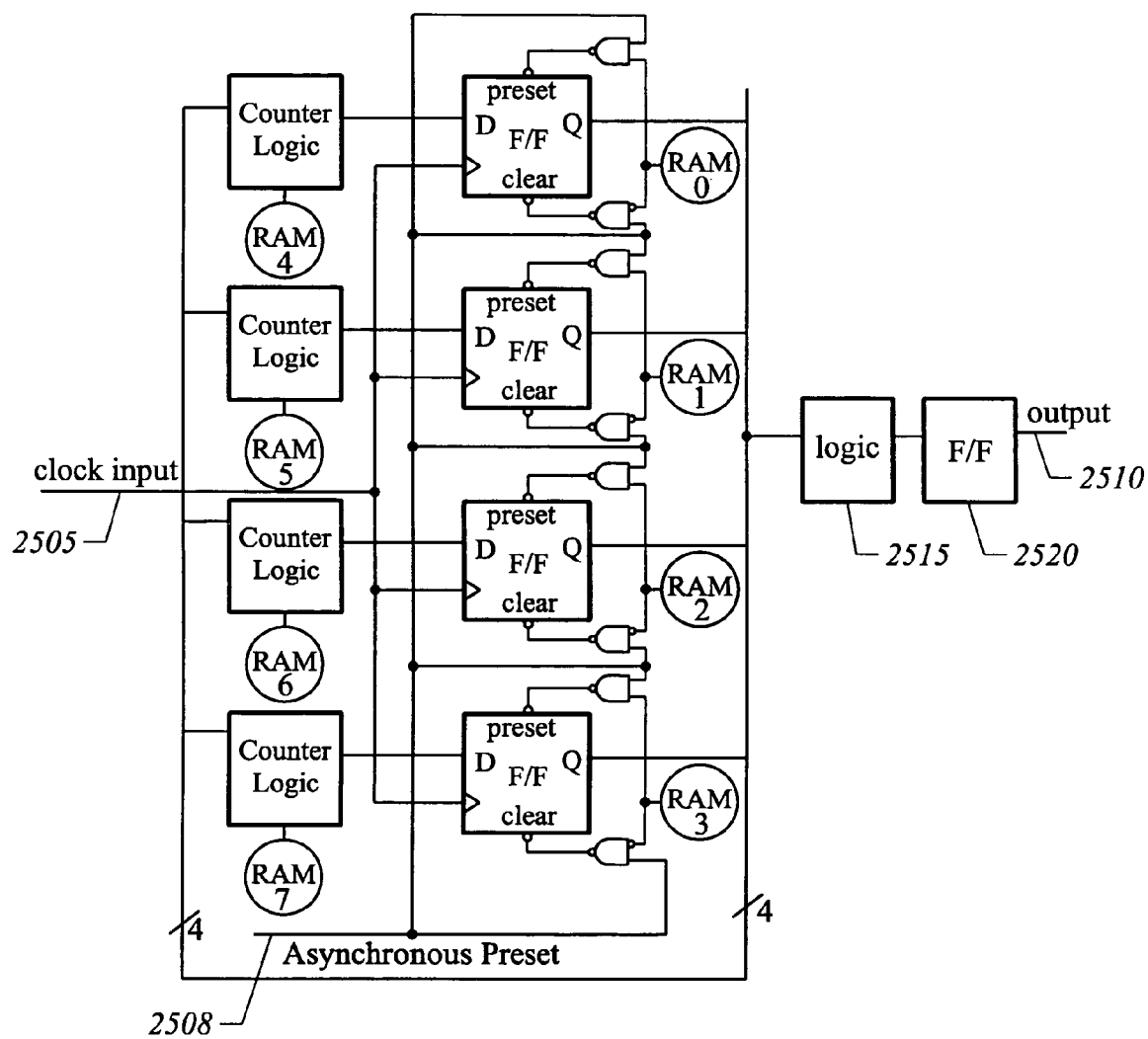
FIG. 25 shows an implementation of a counter for a PLL circuit.

FIG. 25 shows the block diagram of counters M and K. Similar circuitry may be used to implement both the M and K counters. In fact, in one embodiment, both counters M and K have the same counter circuitry as shown in FIG. 25. In the figure, only four bits of an eight bit counter are shown in order to simplify the diagram. The counter may have as many (or few) bits as needed by repeating the circuitry for a single bit. In this specific implementation, both counters are down counters with programmable preset or clear. In other embodiments of the invention, however, other types of counters or similar circuitry may also be used.

The counter has a clock input 2505, asynchronous preset input 2508, and output 2510. The counter circuitry is implemented using counter logic and D flip-flop circuitry. Outputs of the D flip-flops are input into more logical circuitry 2515 and another flip-flop 2520.

The value of divider ratio M or K is programmable by RAM bits 4, 5, 6, and 7. The RAM bits control how many bits to count. The output clock will go from low to high when the counter counts to 1. For example, the counter's RAM bits 4, 5, 6, and 7 may be programmed with 20. This counter will count down from 20 to 1. As another example, the counter may be programmed with 10. This counter will count down from 10 to 1.

The initial value of the counter can be programmed by RAM bits 0, 1, 2, and 3. By programming the initial value of M counter ($M_{init}$) to be different than the initial value of K counter ($K_{init}$), the contents of the M counter and K counter will maintain a fixed offset in the phase between the output clock and external clock. Therefore the output clock and input clock will have a fixed phase shift, since the input clock must be in phase with the feedback clock. The amount of phase difference is programmably selectable by adjusting the difference between the initial values of the two counters. By programming RAM bits 0, 1, 2, 3 in counter M different from RAM bits 0, 1, 2, 3 in counter K, this provides a coarse adjustment feature for phase shift provided by the circuitry.

In the above embodiment of the invention, both counters M and K are adjustable by programming the RAM bits. However, in another embodiment, only one of the two counter M or K may be adjustable. For example, counter M may have a fixed value, and the counter K will be configured as needed to provide the desired phase shift. Or, counter K may have a fixed value, and the other counter will be configured as needed to provide the desired phase shift. In such implementations, less circuitry may be needed to implement one of the counters since the RAM programming circuitry for one counter isn't needed. This counter may be instead hardwired to hold a particular value. Although the circuitry of the present invention with a single programmable counter may take less integrated circuit area, the circuitry may not provide the user with as much flexibility as the implementation discussed with fully programmable M and K counters.

Figure 26:
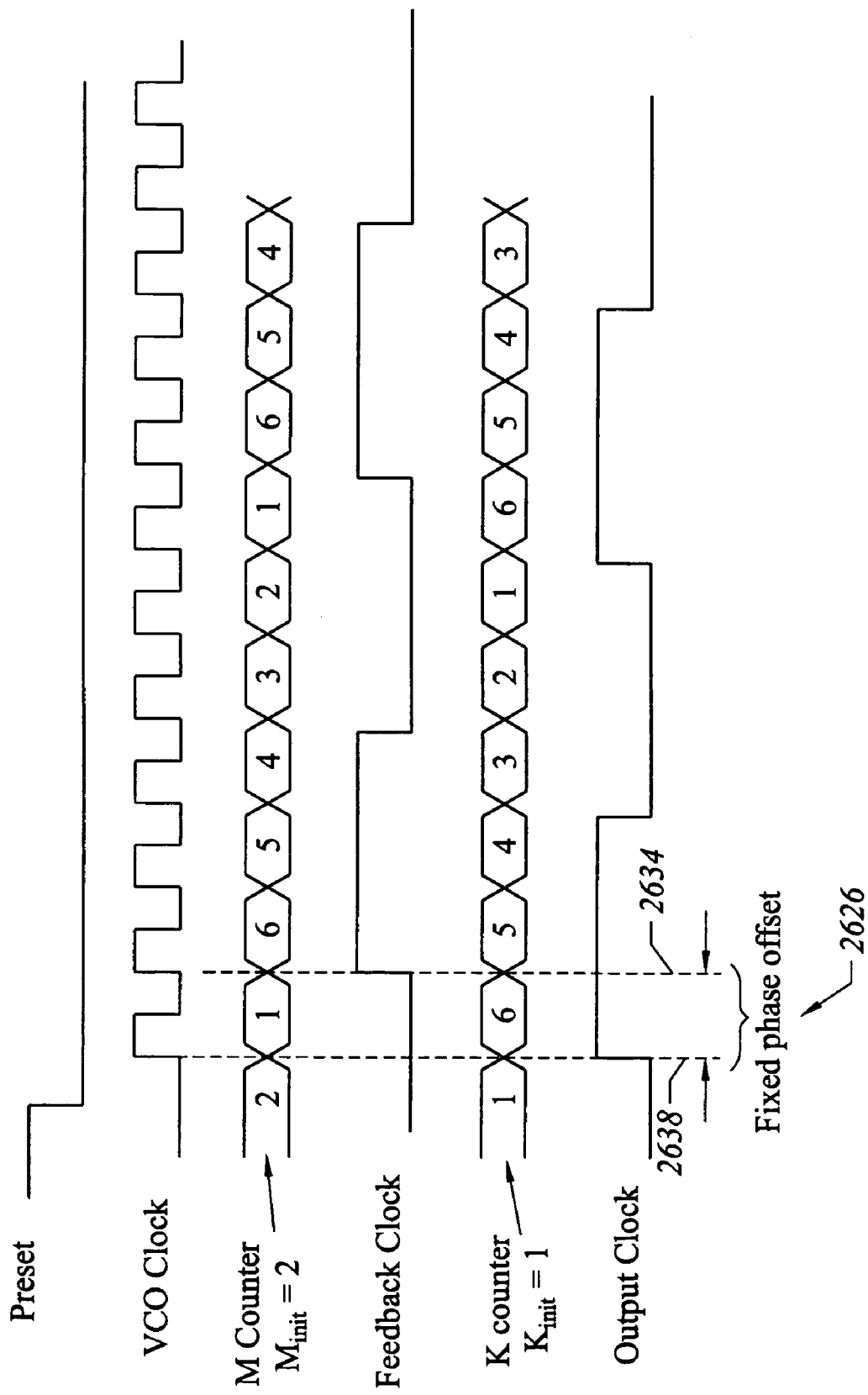
FIG. 26 shows timing diagrams for the PLL circuit of FIG. 24.

FIG. 26 shows a timing diagram for the circuitry in FIG. 24. Timing diagrams are shown for the preset, VCO clock, M counter, feedback clock, K counter, and output clock signals. FIG. 26 shows the timing diagrams for the circuitry for an example when M=K=6. The output frequency $F_{out}=F_{in}*M/K=F_{in}$, since M=K. During a RAM configuration period, both M counter and K counter are preset to their respective initial values. The initial value of M counter is 2, while the initial value of K counter is 1. When the PLL is enabled, both counters start to count. The M counter is lagging behind the K counter by 1. This will cause a fixed phase shift 2626 of one VCO clock period between the output clock and input clock since the input clock is in phase with the feedback clock. The output clock is ahead by 1 bit as a result of the different initial values between counter M and K. This can be adjusted as desired to be 2, 3, 4, or any other number of bits. For a 2-bit lag, there will be a 2 VCO clock period lag between the feedback clock and output clock. The VCO clock may be operating at any desired frequency. However, the VCO frequency may range from about 200 to 400 megahertz in an implementation.

As discussed above, in an embodiment of the invention, there is also a fine adjustment feature by using multiplexer 2432 to select which clock from the VCO inputs to counter M. Selection of an input of the multiplexer to output may be made by using programmable bits, cells, fuses, antifuses, SRAM, Flash, EEPROM, or other techniques and circuitry to implement user programmable features. Using this fine adjustment feature, the feedback clock may be shifted to a particular phase position within one VCO clock period. In other words, the feedback clock may be shifted to a desired phase position from an end of the VCO clock period 2634 to a beginning of the VCO clock period 2638. This causes a corresponding shift in the output clock. The degree of fine adjustment provided is determined by the number of clock outputs provided by the VCO, and how finely divided these clocks are into the VCO clock period. The operational aspects of this feature are somewhat similar to that for the circuitry shown in and discussed for FIG. 16A above.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. A phase-locked loop circuit comprising:
 a voltage controlled oscillator providing a VCO clock output;
 a first counter having a first clock input coupled to the VCO clock output; and
 a second counter having a second clock input coupled to the VCO clock output, wherein:
 the second counter generates an output clock of the phase-locked loop circuit;
 a phase difference between the output clock and an input clock is programmably selectable by storing a first initial value in a first memory of the second counter; and
 a divider ratio of the second counter is stored in a second memory of the second counter.

2. The circuit of claim 1 wherein the first counter generates a feedback clock of the phase-locked loop circuit.

3. The circuit of claim 2 further comprising:
 a phase detector circuit coupled to receive the feedback clock and the input clock of the phase-locked loop circuit.

4. The circuit of claim 1 further comprising:
 a multiplexer coupled between the VCO clock output and the first counter.

5. The circuit of claim 1 wherein the first and second counters are down counters.

6. The circuit of claim 1 wherein the first counter and second counter are programmable frequency dividers.

7. The circuit of claim 1 wherein the first and second counters have asynchronous preset inputs.

8. A loop circuit comprising:
 a feedback circuit receiving a reference clock signal and a feedback clock signal;
 a chain of delay stages coupled to the feedback circuit, wherein a delay of the chain of delay stages is variable and at least one of the delay stages comprises bypass circuitry and buffer circuitry, further wherein an output of the bypass circuitry is coupled to an input of the buffer circuitry; and
 enable circuitry with a first input coupled to a source of constant voltage, a second input coupled to an enable signal, and an output coupled to an input of a first delay stage, wherein applying a value to the enable signal holds all voltages in the chain of delay stages substantially constant until another value is applied to the enable signal.

9. The loop circuit of claim 8 wherein:
 the enable circuitry comprises a multiplexer;
 the first input is coupled to one data input of the multiplexer; and
 the second input is coupled to a selector input of the multiplexer.

10. The loop circuit of claim 9 wherein another data input of the multiplexer is coupled to an output of a second delay stage.

11. The loop circuit of claim 8 wherein a third input of the enable circuitry is coupled to an output of a second delay stage.

12. The loop circuit of claim 8 wherein the delay stages are coupled together in a loop.

13. The loop circuit of claim 12 wherein at least one of the delay stages comprises an inverter.

14. The loop circuit of claim 8 wherein a first input of the bypass circuitry is coupled to an output of buffer circuitry of a first one of the delay stages.

15. The loop circuit of claim 14 further wherein a second input of the bypass circuitry is coupled to an output of buffer circuitry of a second one of the delay stages.

16. The loop circuit of claim 8 further comprising:
 selection circuitry, wherein:
 inputs of the selection circuitry are coupled to outputs of the delay stages; and
 an output of the selection circuitry is coupled to the feedback clock signal.

17. The loop circuit of claim 16 wherein:

one of the delay stage outputs that is coupled to an input of the selection circuitry is also coupled to an output of the loop circuit without passing through the selection circuitry.

18. The loop circuit of claim 8 further comprising:

selection circuitry, wherein:

inputs of the selection circuitry are coupled to outputs of the delay stages; and an output of the selection circuitry is coupled to an output of the loop circuit.

19. The loop circuit of claim 18 wherein:

one of the delay stage outputs that is coupled to an input of the selection circuitry is also coupled to the feedback clock signal without passing through the selection circuitry.

\* \* \* \* \*